US011123922B2

(12) United States Patent
Satoh

(10) Patent No.: US 11,123,922 B2
(45) Date of Patent: Sep. 21, 2021

(54) METHOD OF MANUFACTURING SOLID FREEFORM FABRICATION OBJECT AND DEVICE FOR MANUFACTURING SOLID FREEFORM FABRICATION OBJECT

(71) Applicant: RICOH COMPANY, LTD., Tokyo (JP)

(72) Inventor: Shinichiroh Satoh, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 16/599,428

(22) Filed: Oct. 11, 2019

(65) Prior Publication Data

US 2020/0114577 A1    Apr. 16, 2020

(30) Foreign Application Priority Data

Oct. 11, 2018   (JP) .............................. JP2018-192477

(51) Int. Cl.
*B29C 64/188* (2017.01)
*B33Y 10/00* (2015.01)
*B33Y 30/00* (2015.01)
*B29C 64/165* (2017.01)
*B29C 64/205* (2017.01)
*B29C 64/20* (2017.01)

(52) U.S. Cl.
CPC .......... *B29C 64/188* (2017.08); *B29C 64/165* (2017.08); *B29C 64/20* (2017.08); *B29C 64/205* (2017.08); *B33Y 10/00* (2014.12); *B33Y 30/00* (2014.12)

(58) Field of Classification Search
CPC ..... B29C 64/188; B29C 64/205; B29C 64/20; B29C 64/165; B22F 10/00; B22F 10/14
See application file for complete search history.

(56) References Cited

U.S. PATENT DOCUMENTS

| 2015/0259247 | A1  | 9/2015  | Watanabe |
| 2015/0266239 | A1* | 9/2015  | Okamoto .............. B29C 64/214 428/413 |
| 2015/0343533 | A1  | 12/2015 | Park et al. |
| 2016/0038633 | A1  | 2/2016  | Watanabe |
| 2016/0040025 | A1  | 2/2016  | Norikane et al. |

(Continued)

FOREIGN PATENT DOCUMENTS

| EP | 2 910 363 A1 | 8/2015 |
| EP | 3 311 984 A1 | 4/2018 |

(Continued)

OTHER PUBLICATIONS

Extended European Search Report dated Feb. 7, 2020 in European Patent Application No. 19202272.1, 8 pages.

*Primary Examiner* — Mary Lynn F Theisen

(74) *Attorney, Agent, or Firm* — Grüneberg and Myers PLLC

(57) ABSTRACT

A method of manufacturing a solid freeform fabrication object includes forming a fabrication layer containing a solid freeform fabrication material containing a powder material, a binder material, and a solvent, forming a void in the fabrication layer in a ratio of the void of 20 percent by volume or more in the fabrication layer, curing a predetermined region in the fabrication layer by applying a curing liquid to the predetermined region to form a cured layer, and repeating laminating the cured layer.

18 Claims, 9 Drawing Sheets

(56) References Cited

U.S. PATENT DOCUMENTS

| | | |
|---|---|---|
| 2016/0067929 A1 | 3/2016 | Park |
| 2016/0075084 A1 | 3/2016 | Sakura |
| 2016/0075085 A1 | 3/2016 | Sasaki |
| 2016/0144573 A1* | 5/2016 | Hirata .................. C04B 35/634 428/411.1 |
| 2016/0160021 A1 | 6/2016 | Kojima et al. |
| 2016/0177122 A1 | 6/2016 | Naruse et al. |
| 2016/0200908 A1 | 7/2016 | Osaka et al. |
| 2016/0214320 A1 | 7/2016 | Sasaki et al. |
| 2016/0236412 A1 | 8/2016 | Kusahara et al. |
| 2016/0236422 A1 | 8/2016 | Sakura |
| 2016/0243765 A1 | 8/2016 | Sasaki et al. |
| 2016/0243805 A1 | 8/2016 | Satoh |
| 2016/0271695 A1 | 9/2016 | Osaka et al. |
| 2016/0271877 A1 | 9/2016 | Suzuki et al. |
| 2016/0271879 A1 | 9/2016 | Yamashita et al. |
| 2016/0272817 A1 | 9/2016 | Naruse et al. |
| 2016/0272844 A1 | 9/2016 | Osaka et al. |
| 2016/0288206 A1 | 10/2016 | Ohtaki et al. |
| 2016/0339602 A1* | 11/2016 | Kato .................. B29C 64/165 |
| 2016/0361874 A1 | 12/2016 | Park et al. |
| 2016/0368212 A1 | 12/2016 | Matsubara |
| 2016/0368214 A1 | 12/2016 | Sasaki et al. |
| 2016/0368806 A1 | 12/2016 | Yamaguchi et al. |
| 2017/0072646 A1 | 3/2017 | Sakura |
| 2017/0095979 A1 | 4/2017 | Sasaki |
| 2017/0113411 A1 | 4/2017 | Watanabe et al. |
| 2017/0120521 A1 | 5/2017 | Sakura et al. |
| 2017/0144374 A1 | 5/2017 | Ono |
| 2017/0173887 A1 | 6/2017 | Sasaki |
| 2017/0209927 A1 | 7/2017 | Yamashita et al. |
| 2017/0252975 A1 | 9/2017 | Park |
| 2017/0258556 A1 | 9/2017 | Watanabe et al. |
| 2017/0259456 A1 | 9/2017 | Sasaki et al. |
| 2017/0266880 A1 | 9/2017 | Matsubara |
| 2017/0305141 A1 | 10/2017 | Sakura |
| 2017/0305142 A1 | 10/2017 | Yamaguchi |
| 2017/0326645 A1 | 11/2017 | Saito et al. |
| 2018/0000571 A1 | 1/2018 | Watanabe |
| 2018/0093326 A1* | 4/2018 | Ishida .................. B33Y 70/00 |
| 2018/0237610 A1 | 8/2018 | Watanabe et al. |
| 2018/0326491 A1 | 11/2018 | Koike et al. |
| 2019/0283317 A1 | 9/2019 | Park et al. |

FOREIGN PATENT DOCUMENTS

| | | |
|---|---|---|
| JP | 2015-083392 | 4/2015 |
| JP | 2016-198954 | 12/2016 |
| WO | WO 01/72502 A1 | 10/2001 |

* cited by examiner

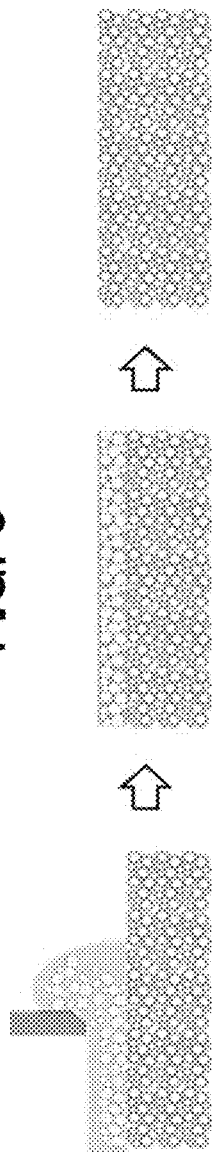
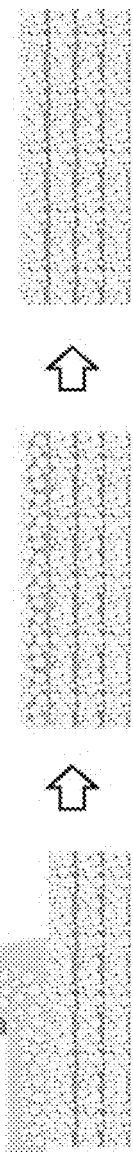
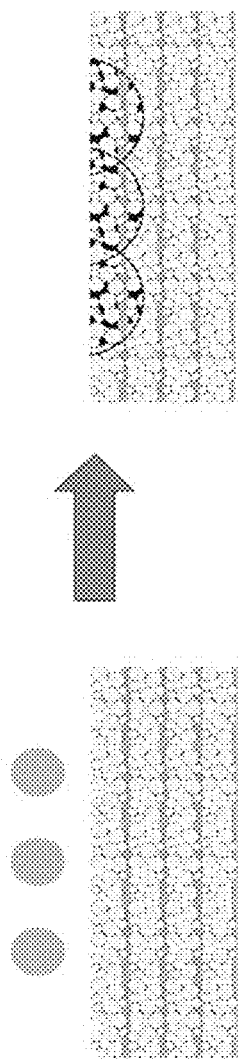
FIG. 3
FIG. 4
FIG. 5

METHOD OF MANUFACTURING SOLID FREEFORM FABRICATION OBJECT AND DEVICE FOR MANUFACTURING SOLID FREEFORM FABRICATION OBJECT

CROSS-REFERENCE TO RELATED APPLICATIONS

This patent application is based on and claims priority pursuant to 35 U.S.C. § 119 to Japanese Patent Application No. 2018-192477, filed on Oct. 11, 2018 in the Japan Patent Office, the entire disclosure of which is hereby incorporated by reference herein.

BACKGROUND

Technical Field

The present invention relates to a method of manufacturing a solid freeform fabrication object and a device for manufacturing a solid freeform fabrication object.

Description of the Related Art

As a method of manufacturing a three-dimensional object (solid freeform fabrication object), for example, a powder additive manufacturing method is known in which powder material is cured to form a layer (fabrication layer) and the layer is repeatedly formed and laminated to manufacture a solid freeform fabrication object. The powder additive manufacturing method includes a selective laser sintering (SLS) method, an electron beam sintering (EBM) method, a binder jetting (BJ) method, etc.

In the BJ method, a binder ink (curing liquid) is discharged from an inkjet head to a fabrication layer formed using gypsum, etc., to repeatedly cure and laminate the fabrication layer to manufacture a solid freeform fabrication object. Moreover, the BJ method is appealing as a technology for directly fabricating a metal part in which metal particles and ceramic particles can also be used as a material to form a fabrication layer followed by sintering an obtained solid freeform fabrication object.

SUMMARY

According to embodiments of the present disclosure, provided is a method of manufacturing a solid freeform fabrication object which includes forming a fabrication layer containing a solid freeform fabrication material containing a powder material, a binder material, and a solvent, forming a void in the fabrication layer in a ratio of the void of 20 percent by volume or more in the fabrication layer, curing a predetermined region in the fabrication layer by applying a curing liquid to the predetermined region to form a cured layer, and repeating laminating the cured layer.

BRIEF DESCRIPTION OF THE SEVERAL VIEWS OF THE DRAWINGS

Various other objects, features and attendant advantages of the present invention will be more fully appreciated as the same becomes better understood from the detailed description when considered in connection with the accompanying drawings in which like reference characters designate like corresponding parts throughout and wherein:

FIG. 3 is a diagram illustrating an example of a change in a state of a fabrication layer from layer formation to void formation;

FIG. 4 is a diagram illustrating another example of a change in a state of a fabrication layer from layer formation to void formation;

FIG. 5 is a diagram illustrating an example of a state in which a curing liquid penetrates a fabrication layer according to an embodiment of the present disclosure;

Figure 1:
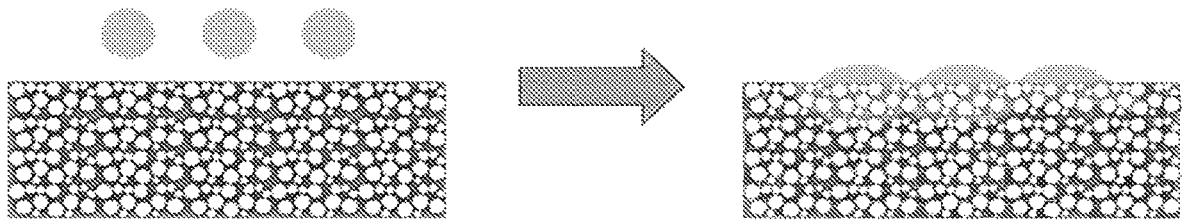
FIG. 1 is a diagram illustrating an example of a state in which a curing liquid penetrates a fabrication layer in typical technologies.

The accompanying drawings are intended to depict example embodiments of the present invention and should not be interpreted to limit the scope thereof. The accompanying drawings are not to be considered as drawn to scale unless explicitly noted. Also, identical or similar reference numerals designate identical or similar components throughout the several views.

DESCRIPTION OF THE EMBODIMENTS

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

As used herein, the singular forms "a", "an", and "the" are intended to include the plural forms as well, unless the context clearly indicates otherwise.

Moreover, image forming, recording, printing, modeling, etc., in the present disclosure represent the same meaning, unless otherwise specified.

Embodiments of the present invention are described in detail below with reference to accompanying drawing(s). In describing embodiments illustrated in the drawing(s), specific terminology is employed for the sake of clarity. However, the disclosure of this patent specification is not intended to be limited to the specific terminology so selected, and it is to be understood that each specific element includes all technical equivalents that have a similar function, operate in a similar manner, and achieve a similar result.

For the sake of simplicity, the same reference number will be given to identical constituent elements such as parts and materials having the same functions and redundant descriptions thereof omitted unless otherwise stated.

In the powder additive manufacturing method such as the BJ method, it is preferable to use a powder material having a small particle diameter in terms of enhancing the surface quality of a solid freeform fabrication object and shortening the time to be taken for sintering after fabrication.

However, just using a powder material having a small particle diameter causes a problem such as partial aggregation of the powder material caused by the application of the binder ink.

In an attempt to solve this problem, a technology of using a powder material has been proposed in a form of suspension (slurry) obtained by dispersing the powder material in a resin solution in which an ultraviolet ray curable resin, etc., are dissolved (JP-2015-83392-A1).

According to the present disclosure, a method of manufacturing a solid freeform fabrication object is provided which makes curing liquid easily permeate a fabrication layer containing a powder material to enhance fabrication accuracy and strength of a solid freeform fabrication object while preventing scattering of powder material having a small particle diameter and deterioration of filling property.

Method of Manufacturing Solid Freeform Fabrication Object and Device for Manufacturing Solid Freeform Fabrication Object The method of manufacturing a solid freeform fabrication object of the present disclosure includes forming a fabrication layer containing a solid freeform fabrication material containing a powder material, a binder material, and a solvent, forming a void in the fabrication layer in a ratio of the void of 20 percent by volume or more in the fabrication layer, curing a predetermined region in the fabrication layer by applying a curing liquid to the predetermined region to form a cured layer, and repeating laminating the cured layer, and preferably includes separating and sintering, and furthermore optionally includes other optional processes.

The device for manufacturing a solid freeform fabrication object of the present disclosure includes a layer forming device configured to form a fabrication layer containing a solid freeform fabrication material containing a powder material, a binder material, and a solvent, a void forming device configured to form a void in the fabrication layer in a proportion of the void of 20 percent by volume or more in the fabrication layer, and a curing device configured to apply a curing liquid to a predetermined region in the fabrication layer to cure the predetermined region to form a cured layer and preferably includes a separating device and a sintering device, and furthermore optionally includes other devices.

The method of manufacturing a solid freeform fabrication object is suitably executed by the device for manufacturing a solid freeform fabrication object, the layer forming is suitably executed by the layer forming device, the void forming device is suitably executed by the void forming device, the curing is suitably executed by the curing device, the separating can be suitably executed by the separating device, the sintering is suitably executed by the sintering device, and other optional method is suitably executed by the other optional devices.

In addition, the present disclosure is based on the knowledge that, in a typical manufacturing method of manufacturing a solid freeform fabrication object, a curing liquid is difficult to permeate a fabrication layer containing a powder material, and the fabrication accuracy and strength of the solid freeform fabrication object may deteriorate.

In the powder additive manufacturing method such as the BJ method, using a powder material having a large particle diameter causes problems such as a decrease in surface quality and an increase in the time taken for sintering conducted after the fabrication of the solid freeform fabrication object. Therefore, in order to solve these problems, it is desirable to use a powder material having a small particle diameter.

However, just using a powder material having a small particle diameter causes a problem such as partial aggregation of the powder material due to the application of the binder ink. For example, in the BJ method, in the powder material region to which the binder ink is applied, the powder material agglomerates due to the liquid cross-linking force, so that the powder material is in a state of uneven density. In this case, the sparse part in the powder material may remain in a solid freeform fabrication object as an internal defect. If there is an internal defect in the solid freeform fabrication object, it may cause a decrease in the strength of the solid freeform fabrication object. In order to prevent the formation of such internal defects, it is necessary to make the powder material of the binder ink in a highly filled state. However, when the powder material has a small particle diameter, the flowability of the powder material significantly decreases, which makes it difficult to improve the filling property.

As a technology for solving these problems when using powder materials having a small particle diameter, as described above, the technology of using powder material in a state (slurry) in which the powder material is dispersed and suspended in a resin solution in which an ultraviolet curable resin, etc., are dissolved. In this typical technology, the slurry is irradiated with ultraviolet rays to cause the curing resin to undergo a curing reaction.

However, in this typical technology, when curing the slurry by irradiation with ultraviolet rays, the powder material blocks the ultraviolet rays depending on the type of the powder material, so that the inside of the slurry is not irradiated with sufficiently strong ultraviolet rays, thereby failing to sufficiently cure the slurry. Further, in this typical technology, when applying the curing liquid to the slurry, the space between the powder material is filled with the resin solution, so that the curing liquid does not easily permeate between the powder material sufficiently and it is difficult to control the region which the curing liquid permeates. Therefore, in this typical technology, the fabrication accuracy and strength of a solid freeform fabrication object may deteriorate.

FIG. 1 is a diagram illustrating an example of a state in which a curing liquid penetrates a fabrication layer in typical technologies. As illustrated in FIG. 1, in the typical technology, the space between the powder is filled with the resin solution when the curing liquid is applied. Therefore, in the typical technology, since the permeation of the curing liquid occurs due to diffusion into the resin solution, the curing liquid does not easily permeate between the powder material sufficiently and it is difficult to control the region which the curing liquid permeates.

Figure 2:
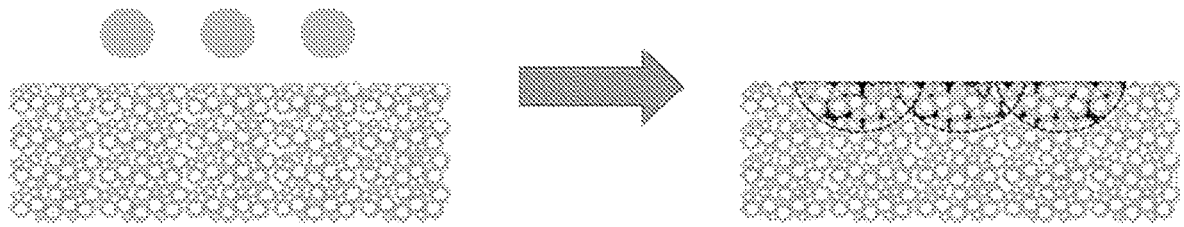
FIG. 2 is a diagram illustrating an example of a state in which a curing liquid penetrates a fabrication layer according to an embodiment of the present disclosure.

Conversely, in the method of manufacturing a solid freeform fabrication object of the present disclosure, a curing liquid is applied after voids are formed in the fabrication layer. FIG. 2 is a diagram illustrating an example of a state in which a curing liquid penetrates a fabrication layer in the present disclosure. As illustrated in FIG. 2, in the present disclosure, after forming voids in the fabrication layer, a curing liquid is applied thereto. Therefore, the fabrication layer has a porous structure, and the applied curing liquid isotropically permeates the fabrication layer by capillary force. The method of manufacturing a solid freeform fabrication object of the present disclosure prevents scattering of powder material having a small particle diameter and deterioration of filling property and makes a curing liquid easily permeate a fabrication layer containing the powder material to enhance fabrication accuracy and strength of the solid freeform fabrication object.

Layer Forming and Layer Forming Device

In the layer forming, a fabrication layer containing a solid freeform fabrication material containing a powder material, a binder material, and a solution is formed.

The layer forming device forms a fabrication layer containing a solid freeform fabrication material containing a powder material, a binder material, and a solution.

The layer forming is not particularly limited as long as a fabrication layer made of the solid freeform fabrication material is formed and can be suitably selected to suit to a particular application. For the layer forming, for example, a method using a known counter rotation assembly (counter roller), a method of spreading a solid freeform fabrication material into a thin layer using a member such as a brush, a roller, and a blade, a method of pressing and spreading the surface of a solid freeform fabrication material into a thin layer by a pressing member, and a method using a known powder additive manufacturing device can be applied.

When forming a fabrication layer using a counter rotation assembly (counter roller), a brush, a blade, a pressing member, etc., for example, in an outer frame (also referred to as "mold", "hollow cylinder", "tubular structure", etc.), a solid freeform fabrication material is placed on a support disposed movable up and down while sliding on the inner wall of the outer frame using the counter rotation assembly, the brush, the blade, the pressing member, etc., to form a fabrication layer. At this time, when using a support that is movable up and down in the outer frame, it is preferable that the support be placed at a position slightly below the upper end opening of the outer frame (corresponding to the thickness of the fabrication layer) to place the slurry on the support.

Moreover, it is possible to use a known powder additive manufacturing device to automatically and simply form a fabrication layer. Typically, such a powder additive manufacturing device has a recoater to laminate the powder material, a movable supplying tank to supply the powder material onto the support, and a movable fabrication tank to form layers of the powder material to laminate the layers. In the powder additive manufacturing device, the surface of the supplying tank can be elevated slightly above the surface of the fabrication tank by moving up the supplying tank, moving down the fabrication tank, or both. Therefore, this powder additive manufacturing device can form a powder material layer using a recoater from the side of the supply tank and the powder material layer can be laminated by repeating moving the recoater.

This powder material additive manufacturing device can be entirely replaced with a device for slurry additive manufacturing or the recoater portion can be substituted with a doctor blade for sheet forming to form the fabrication layer.

As a more preferable embodiment of the layer forming and the layer forming device, slurry is supplied from a storage tank to store the slurry, which is disposed above the holding device (support) to the support through the nozzle of the storage tank. Such an aspect will be described in detail in Examples.

Fabrication Layer

The fabrication layer contains a solid freeform fabrication material containing a powder material, a binder material, and a solvent.

There is no specific limitation to the thickness of the fabrication layer and it can be suitably selected to suit to a particular application. The thickness of the fabrication layer is preferably not less than twice and not more than 20 times the particle diameter of the powder material, taking it into account, for example, changes in physical properties of the fabrication layer ascribable to the particle diameter of the powder material. Conversely, the thickness of the fabrication layer is preferably 100 μm or less in terms of easiness of forming voids by, for example, volatilizing the solvent. That is, the thickness of the fabrication layer can be appropriately adjusted according to the particle diameter of the powder material to be used, the method of forming voids in the void forming, etc.

Solid Freeform Fabrication Material

The solid freeform fabrication material contains a powder material, a binder material, and a solvent, and further contains other optional materials.

Powder Material

The powder material is not particularly limited and can be suitably selected to suit to a particular application. Specific examples include, but are not limited to, powders of stainless (SUS) steel, iron, silver, copper, titanium, aluminum, alumina, zirconia, aluminum nitride. These can be used alone or in combination.

There is no specific limitation to the SUS steel and it can be suitably selected to suit to a particular application. Specific examples include, but are not limited to, SUS301, SUS302, SUS303, SUS304, SUS305, SUS309S, SUS310S, SUS312L, SUS315J1, SUS316, SUS316L, SUS316N, SUS316LN, SUS316J1, SUS316J1L, SUS317, SUS321, SUS347, SUS836L, and SUS890L.

Specific examples of commercially available products that can be used as the powder material include, but are not limited to, "PSS316L" (manufactured by SANYO SPECIAL STEEL Co., Ltd.) as SUS316L, "TILOP" (manufactured by Osaka Titanium Technologies Co., Ltd.) as titanium, and "A1070-30BB" as aluminum (manufactured by Toyo Aluminium K.K.).

Binder Material

The binder is not particularly limited as long as it is soluble in a solvent, and can be suitably selected to suit to a particular application. "The binder material is dissolved in the solvent" means that when the binder material is dissolved by 90 percent by mass or more when 1 g of binder material is mixed with and sufficiently stirred in 100 g of the solvent having a temperature of 30 degrees C.

Examples of the binder material include, but are not limited to, a resin and a water-soluble prepolymer. Examples of the resin include, but are not limited to, a water-soluble resin and a water-insoluble (oil-soluble) resin, and a water-soluble resin is preferable.

Specific examples of the water-soluble resins include, but are not limited to, polyvinyl alcohol resins, polyacrylic acid resins, cellulose resins, starch, gelatin, vinyl resins, amide resins, imide resins, acrylic resins, and polyethylene glycol. Homopolymers (monopolymers), heteropolymers (copolymers), and modified resins are allowed if these are water soluble. Moreover, known functional groups can be introduced thereinto and the form of a salt is also allowed.

Accordingly, for example, in the case of a polyvinyl alcohol resin, polyvinyl alcohol (PVA) is suitable and modified polyvinyl alcohol modified by an acetoacetyl group, an acetyl group, or silicone (acetoacetyl group-modified polyvinyl alcohol, acetyl group-modified polyvinyl alcohol, silicone modified polyvinyl alcohol, etc.) are also suitable. In addition, butanediol vinyl alcohol copolymers are also optional.

Moreover, in the case of a polyacrylic acid resin, polyacrylic acid and salts such as sodium polyacrylate are suitable.

In addition, in the case of a cellulose resin, for example, cellulose is suitable and carboxymethyl cellulose (CMC) is also suitable. Moreover, in the case of an acrylic resin, polyacrylic acid and a copolymer of acrylic acid and maleic anhydride are suitable.

In the case of a water-soluble prepolymer, for example, an adhesive water-soluble isocyanate prepolymer contained in a water sealant is suitable.

As the water-insoluble organic materials, the following resins are suitable: acrylic acid resins, maleic acid resins, silicone resins, butyral, polyester resins, polyvinyl acetate resins, copolymers of vinyl chloride and vinyl acetate, polyethylene resins, polypropyle resins, polyacetal resins, copolymers of ethylene and vinyl chloride, copolymers of ethylene and (meth)acrylic acid, copolymers of α-olefin and maleic anhydride, esterified compounds of copolymers of α-olefin and maleic anhydride, polystyrene resins, poly (meth)acrylates, copolymers of α-olefin, maleic anhydride, and monomers containing a vinyl group, copolymers of styrene and maleic anhydride, copolymers of styrene and (meth)acrylate, polyamide resins, epoxy resins, xylene resins, ketone resins, petroleum resins, rosin or derivatives thereof, coumarone indene resins, terpene resins, polyurethane resins, and synthesized rubber such as styrene/butadiene rubber, polyvinyl butyral, nitrile rubber, acrylic rubber, and ethylene/propylene rubber, and nitrocellulose.

Moreover, the resin preferably has a cross-linkable functional group.

Such cross-linkable functional groups have no specific limit and can be suitably selected to suit to a particular application. Specific examples include, but are not limited to, hydroxyl group, carboxylic group, amide group, phosphoric acid group, thiol group, acetoacetyl group, and ether bond. The resin having such a cross-linkable functional group is preferable in terms that the resin is easily cross-linked to form a cured material (solid freeform fabrication object). Of these, polyvinyl alcohol resins having an average degree of polymerization of from 400 to 1,100 are preferable.

The resin can be used alone or in combination. In addition, it is suitable to synthesize such a resin and use products available on the market.

Specific examples of the products available on the market include, but are not limited to, polyvinyl alcohol (PVA-205C and PVA-220C, manufactured by KURARAY CO., LTD. and POVAL, manufactured by JAPAN VAM & POVAL CO., LTD.), polyacrylic acids (JURYMER® AC-10, manufactured by TOAGOSEI CO., LTD.), sodium polyacrylate (JURYMER® AC-103P, manufactured by TOAGOSEI CO., LTD.), acetoacetyl group-modified polyvinyl alcohol (Gohsenx™ Z-300, Gohsenx™ Z-100, Gohsenx™ Z-200, Gohsenx™ Z-205, Gohsenx™ Z-210, and Gohsenx™ Z-220, manufactured by The Nippon Synthetic Chemical Industry Co., Ltd.), copolymers of carboxy group-modified polyvinyl alcohol (Gohsenx™ T-330, Gohsenx™ T-350, and Gohsenx™ T-330T, manufactured by The Nippon Synthetic Chemical Industry Co., Ltd.), copolymers of butanediol and vinyl alcohol (Nichigo G-Polymer OKS-8041, manufactured by The Nippon Synthetic Chemical Industry Co., Ltd.), sodium carboxymethyl cellulose (CELLOGEN 5A and CELLOGEN 6A, manufactured by DKS Co. Ltd.), starch (Histard PSS-5, manufactured by Sanwa Starch Co., Ltd.), and gelatin (beMatrix®, manufactured by Nitta Gelatin Inc.).

Viscosity of the solvent (binder material solution) is preferably 40 mPa·s or less, more preferably from 1 to 35 mPa·s, and particularly preferably from 5 to 30 mPa·s.

If the viscosity of the binder material solution is 40 mPa·s or less, the strength of a solid freeform fabrication object can be enhanced, so that the deformation of the solid freeform fabrication object can be prevented when sintering the solid freeform fabrication object. Moreover, when the binder material solution has a viscosity of 40 mPa·s or less, fabrication accuracy of a solid freeform fabrication object can be improved.

The viscosity of the binder solution means the viscosity of the binder material solution having a binder concentration of 4 percent by mass and a temperature of 20 degrees C. and can be measured according to JIS K7117 format.

A binder material is preferable that causes a cross-linking reaction when a curing liquid is applied. The binder material is cross-linked with the curing liquid, thereby enhancing the strength of a solid freeform fabrication object.

Moreover, the binder material is preferably from 1 to 20 percent by volume and more preferably from 5 to 10 percent by volume in the volume of powder material in a solid freeform fabrication object.

When the proportion of the binder material is from 1 to 20 percent by volume in the volume of the powder material in the solid freeform fabrication material, the strength and the fabrication accuracy of the solid freeform fabrication object can be enhanced because voids can be easily formed in the solid freeform fabrication material during the void forming.

Solvent

The solvent has no particular limit and can be suitably selected to suit to a particular application. For example, alcohols such as water, methanol, ethanol, and toluene are selectable. These can be used alone or in combination. The solvent may contain a small quantity of components such as the alcohol other than water.

As the solvent, those which volatilize by natural drying is preferable and water is preferable in consideration of recyclability and environmental safety.

Moreover, the proportion of the solvent is preferably 28 percent by volume or more, more preferably from 35 to 45 percent by volume, and particularly preferably from 35 to 40 percent by volume in the entire of the solid freeform fabrication material.

When the proportion of the solvent is 28 percent by volume or more in the solid freeform fabrication material, flowability of the solid freeform fabrication material can be enhanced, thereby easily forming a fabrication layer. Conversely, when the proportion of the solvent is 45 percent by volume or less in the entire solid freeform fabrication material, the solvent can be volatilized in a short time when the solvent is volatilized in the void forming.

Other Optional Materials

The other optional materials are not particularly limited and can be suitably selected to suit to a particular application. Examples are a surfactant, a sintering helping agent, and a dispersant. Moreover, it is preferable that the proportion of the other optional materials be 1 percent by mass or less.

The surfactant is not particularly limited and can be suitably selected to suit to a particular application. When the solid freeform fabrication material contains a surfactant, permeability of the curing liquid can be improved, so that the strength and fabrication accuracy of a solid freeform fabrication object can be further improved.

As the surfactants, for example, fluorochemical surfactants, anionic surfactants, nonionic surfactants, and ampholytic surfactants can be suitably used.

Specific examples of the anionic surfactants include, but are not limited to, polyoxyethylene alkylether acetates, dodecyl benzene sulfonates, succinic acid ester sulfonates, laurates, and polyoxyethylene alkylether sulfates.

Specific examples of the nonionic surfactants include, but are not limited to, polyoxyethylene alkylether, polyoxyethylene polyoxypropylene alkyl ethers, polyoxyethylene alkylesters, polyoxyethylene polyoxypropylene alkylesters, polyoxyethylene sorbitan aliphatic acid esters, polyoxyethylene alkylphenyl ethers, polyoxyethylene alkylamines, and polyoxyethylene alkylamides.

Specific examples of the ampholytic surfactants include, but are not limited to, lauryl aminopropionic acid salts, lauryl dimethyl betaine, stearyl dimethyl betaine, and lauryl dihydroxyethyl betaine.

Specific examples of the surfactant include, but are not limited to, lauryldimethyl amineoxide, myristyl dimethyl amineoxide, stearyldimethyl amineoxide, dihydroethyl lauryl amineoxide, polyoxyethylene palm oil alkyldimethyl amineoxide, dimethylalkyl (palm) betaine, and dimethyl laurylbetaine. These surfactants are available from Nikko Chemicals Co., Ltd., NIHON EMULSION Co., Ltd., Nippon Shokubai Co., Ltd., TOHO Chemical Industry Co., Ltd., Kao Corporation, ADEKA CORPORATION, Lion Corporation, AOKI OIL INDUSTRIAL CO., LTD., and Sanyo Chemical Industries, Ltd.

Specific examples of the acetylene glycol-based surfactants include, but are not limited to, acetylene glycols such as 2,4,7,9-tetramethyl-5-desine-4,7-diol, 3,6-dimethyl-4-octine-3,6-diol, and 3,5-dimethyl-1-hexine-3-ol {(for example, SURFYNOL® 104, 82, 465, 485, and TG, manufactured by AIR PRODUCTS and CHEMICALS, INC. (US)}. Of these, SURFYNOL® 104, 465, and TG are particularly good.

Specific examples of the fluorochemical surfactants include, but are not limited to, perfluoroalkyl sulfonic acid salts, perfluoroalkyl carboxylic acid salts, perfluoroalkyl phosphoric acid esters, adducts of perfluoroalkyl ethylene oxide, perfluoro alkyl betaine, perfluoro alkyl amine oxide compounds, polyoxyalkylene ether polymers having a perfluoro alkyl ether group at its side chain and sulfuric acid ester salts thereof, and fluorine-containing aliphatic polymer esters.

Specific examples of the fluorochemical surfactants available on the market include, but are not limited to, SURFLON S-111, SURFLON S-112, SURFLON S-113, SURFLON S-121, SURFLON S-131, SURFLON S-132, SURFLON S-141, and SURFLON S-145 (all manufactured by ASAHI GLASS CO., LTD.); FLUORAD FC-93, FC-95, FC-98, FC-129, FC-135, FC-170C, FC-430, FC-431, and FC-4430 (all manufactured by SUMITOMO 3M); FT-110, FT-250, FT-251, and FT-400S (manufactured by NEOS COMPANY LIMITED); ZONYL FS-62, ZONYL FSA, ZONYL FSE, ZONYL FSJ, ZONYL FSP, ZONYL TBS, ZONYL UR, ZONYL FSO, ZONYL FSO-100, ZONYL FSN N, ZONYL FSN-100, ZONYL FS-300, and ZONYL FSK (all manufactured by E.I. du Pont de Nemours and Company); POLYFOX PF-136A, PF-156A, and PF-151N (manufactured by OMNOVA SOLUTIONS INC.).

Moreover, when a solid freeform fabrication material contains a sintering helping agent, sintering property ameliorates during sintering treatment to a solid freeform fabrication object, so that the solid freeform fabrication object can be sintered at lower temperatures. Furthermore, inclusion of a dispersant in a solid freeform fabrication material improves dispersibility of the powder material, which facilitates forming of a fabrication layer.

The volume ratio of the powder material to the solvent in the solid freeform fabrication material is from 1.1 to 1.5.

Void Forming Process and Void Forming Device

During the void forming, voids are formed in a fabrication layer in a proportion of 20 percent by volume or more in the fabrication layer.

The void forming device forms voids in a fabrication layer in a proportion of 20 percent by volume or more in the fabrication layer.

Moreover, the ratio of the void in the fabrication layer may be referred to as porosity. The porosity should just be 20 percent by volume or more after the void forming (after a predetermined processes, such as removal of the solvent described later).

The void forming is not particularly limited and can be suitably selected to suit to a particular application. For example, it is suitable to remove the solvent or produce foams in a fabrication layer.

Of these, it is preferable to remove the solvent in the fabrication layer during the void forming. Due to the removal of the solvent in a fabrication layer, voids are efficiently formed in the fabrication layer.

Therefore, the case where the solvent in a fabrication layer is removed during the void forming is described below.

There is no particular limit to the method of removing the solvent in a fabrication layer and it can be suitably selected to suit to a particular application. For example, it is suitable to volatilize the solvent.

There is no particular limit to the method of volatilizing the solvent in a fabrication layer and it can be suitably selected to suit to a particular application. For example, it is suitable to select natural drying, air blowing to the fabrication layer, heating the fabrication layer, or utilizing the invention of adding a light absorbing agent to the fabrication layer.

Of these, as the method of volatilizing a solvent in the fabrication layer, air blowing to the fabrication layer is preferable. That is, it is preferable to blow air to the fabrication layer to volatilize the solvent in the void forming. When the solvent is removed by blowing air to the fabrication layer in the void forming, the solvent is efficiently removed in a short time to form voids, thereby improving productivity of a solid freeform fabrication object.

There is no specific limit to the void forming device and it can be suitably selected to suit to a particular application. For example, a known air blowing device and heating device can be used.

Voids can be suitably formed by a void forming device but the void forming is not limited thereto. For example, it is possible to naturally dry the fabrication layer without using a void forming device.

Moreover, when the solvent in the fabrication layer is removed to form voids, it is preferable to drive the void forming device in synchronization with the layer forming device. Specifically, it is preferable that the void forming unit start removing the solvent in the fabrication layer immediately after the layer forming device forms a fabrication layer. Due to such synchronous driving of the void forming device with a layer forming device, the solvent can be more efficiently removed in a short time to form voids, which contributes to improvement of productivity.

In addition, in the void forming, to remove the solvent in the fabrication layer, it is preferable to remove all of the solvent in the fabrication layer. In the void forming, by removing all of the solvent in the fabrication layer, porosity can be increased. Therefore, curing liquid easily permeates the fabrication layer so that fabrication accuracy and strength of a solid freeform fabrication object can be further improved.

In addition, the fabrication layer in the void forming is preferably in a state in which a film made of a binder material is formed on the surface of the powder material in the fabrication layer. When the film of the binder material is formed on the surface of the powder material in a solid freeform fabrication object, attachability between powder is enhanced and strength of a solid freeform fabrication object can be improved.

The film of the binder material is not necessarily formed on the entire surface of the powder material and may be partially formed thereon.

The method of forming a film of the binder material formed on the surface of the powder material is not particularly limited and can be suitably selected to suit to a particular application. For example, such film can be formed by volatilizing and removing the solvent in the solid freeform fabrication material.

FIG. 3 is a diagram illustrating an example of a change in a state of a fabrication layer from the layer formation to the void formation. As illustrated on the left part of FIG. 3, a layer forming device forms a fabrication layer. As illustrated in the center of FIG. 3, since the just-formed fabrication layer contains a solvent, the powder material is surrounded by a binder material solution (in which a binder material is dissolved in the solvent). Thereafter, as illustrated on the right part of FIG. 3, in the void forming, the solvent is removed from the fabrication layer, so that film of the binder material is formed on the surface of the powder material.

In addition, the fabrication layer in the void forming is preferably in a state in which a film made of a binder material is formed on one side (surface) of the fabrication layer. When the film of the binder material is formed on one side of the fabrication layer, attachability between powder and between the fabrication layers is enhanced and strength of a solid freeform fabrication object can be further improved.

In addition, the film of the binder material is not necessarily formed on the entire of one side of the fabrication layer but may be partially formed thereon. Moreover, the thickness of the film of a binder material formed on one side of the fabrication layer is not necessarily uniform but can be locally different.

The method of forming a film of the binder material formed on one side of the fabrication layer is not particularly limited and can be suitably selected to suit to a particular application. For example, such film can be formed by volatilizing the solvent in the solid freeform fabrication material to remove it.

FIG. 4 is a diagram illustrating another example of a change in a state of a fabrication layer from the layer forming to the void forming. As illustrated on the left part of FIG. 4, a layer forming device forms a fabrication layer. As illustrated in the center of FIG. 4, since the just-formed fabrication layer contains a solvent, the powder material is surrounded by a binder material solution (in which a binder material is dissolved in the solvent). Thereafter, as illustrated on the right part of FIG. 4, in the void forming, for example, when the precipitation rate of the binder material is slow, the powder material is exposed on the surface of the fabrication layer as the solvent evaporates. Thereafter, due to the precipitation of the binder material, film made of the binder material can be formed on one side of the modeling layer.

FIG. 5 is a diagram illustrating another example of a state in which a curing liquid permeates a fabrication layer in the present disclosure. As illustrated in FIG. 5, when the film made of the binder material is formed on one side of the fabrication layer, if a curing liquid can dissolve the binder material, the curing liquid penetrates downward while dissolving the binder material present between the fabrication layers. Therefore, when the film of the binder material is formed on one side of the fabrication layer, attachability between powder and between the fabrication layers is enhanced and strength of a solid freeform fabrication object can be further improved.

In addition, the proportion of the binder material in the total of the powder material and the binder material in the fabrication layer is preferably from 1 to 20 percent by volume and more preferably from 5 to 10 percent by volume. In other words, the proportion of the powder material in the total of the powder material and the binder material in the fabrication layer is preferably from 80 to 99 percent by volume and more preferably from 90 to 95 percent by volume.

When the proportion of the powder material or the binder material in the total of the powder material and the binder material in the fabrication layer is within the above-specified range, the existing ratio of the binder material and the powder material is within a preferable range for the curing, thereby effectively forming a curing layer upon application of the curing liquid. Therefore, when the proportion of the powder material or the binder material in the total of the powder material and the binder material in the fabrication layer is within the above-specified range, fabrication accuracy and strength of a solid freeform fabrication object can be further improved.

Void

Void means a region free of a solid freeform fabrication material in a fabrication layer.

There is no specific limit to the shape of the void formed in the fabrication layer and it can be suitably selected to suit to a particular application. Moreover, the shape may differ one by one.

During the void forming, voids are formed in a fabrication layer in a porosity of 20 percent by volume or more. When voids are formed in the fabrication layer in a porosity of 20 percent by volume or more, sufficient voids can be formed because a curing liquid sufficiently permeates the fabrication layer. Therefore, when the curing liquid easily permeates the fabrication layer, fabrication accuracy and strength of a solid freeform fabrication object can be enhanced.

The porosity in the void forming is not particularly limited as long as it is 20 percent by volume and can be suitably selected to suit to a particular application.

The porosity in the void forming is preferably 30 percent by volume or more and also preferably 45 percent by volume or less.

In addition, although, as the void forming, the case where the solvent is volatilized and removed is described, the void forming is not limited to this. For example, it is possible to add a foaming agent to a fabrication layer, thereby producing foams to form voids in the fabrication layer.

Curing and Curing Device

In the curing, a curing liquid is applied to a particular region in a fabrication layer to cure the particular region to form a cured layer.

The curing device applies a curing liquid to a particular region in a fabrication layer to cure the particular region to form a cured layer.

The curing device is not particularly limited as long as it can apply a curing liquid and can be suitably selected to suit to a particular application. For example, a liquid discharging device can be used which employs, for example, a dispenser method, a spray method, or an inkjet method.

In the present disclosure, the liquid discharging device for use in the inkjet method (which uses an oscillator such as a piezoelectric actuator to discharge droplets from multiple nozzles) is preferable in terms that complex solid freeform objects can be efficiently and precisely fabricated.

Curing Liquid

The curing liquid is not particularly limited as long as it can cure a fabrication layer and can be suitably selected to suit to a particular application. For example, a cross-linking agent solution is usable.

Moreover, the curing liquid may contain components other than the component for curing a fabrication layer. For example, it may contain a colorant. The colorant is not particularly limited and can be suitably selected to suit to a particular application. It is possible to prepare curing liquids for respective colors of colorants contained.

Cross-Linking Agent Solution

The cross-linking agent solution is not particularly limited as long as a solution contains a cross-linking agent and can be suitably selected to suit to a particular application. It may contain other optional components.

The cross-linking agent is not particularly limited as long as it causes a cross-linking reaction with a binder material and can be suitably selected to suit to a particular application. Examples include, but are not limited to, metal salts, metal complexes, polyvalent metal compounds such as organic zirconium-based compounds and organic titanium-based compounds, water-soluble organic cross-linking agents, chelating agents, blocked isocyanates, and melamine compounds.

Specific examples of the cross-linking agents include, but are not limited to, organic zirconium compounds such as zirconium oxychloride, zirconium ammonium carbonate, zirconium oxynitrate, and zirconium ammonium lactate, organic titanium compounds such as titanium acylate, titanium alkoxide, titanium lactate, and titanium diisopropoxybis(triethanolaminate), polyvalent metal compounds such as ferric chloride and highly basic aluminum chloride, the water-soluble organic cross-linking agents mentioned above such as carbodiimide group-containing compounds and bisvinylsulfonic acid compounds, chelating agents such as organic titanium chelates and organic zirconia chelates, and melamine compounds such as methylolated melamine.

As the cross-linking agent, for example, cationic divalent or higher ion metals dissociated in water are suitable.

Specific examples include, but are not limited to, zirconium oxychloride octahydrate (quadrivalent), aluminum hydroxide (trivalent), magnesium hydroxide (divalent), titanium ammonium lactate (quadrivalent), aluminum subacetate (trivalent), zirconium ammonium carbonate (quadrivalent), and titanium triethanol aminate (quadrivalent). These can be used alone or in combination.

Specific examples of the cross-linking agent available on the market include, but are not limited to, zirconium oxychloride octahydrate (zirconium oxychloride, manufactured by DAIICHI KIGENSO KAGAKU KOGYO Co., LTD.), aluminum hydroxide (manufactured by Wako Pure Chemical Industries, Ltd.), magnesium hydroxide (manufactured by Wako Pure Chemical Industries, Ltd.), titanium lactate ammonium salts (Orgatix TC-300 and TC-310, manufactured by Matsumoto Fine Chemical Co. Ltd.), zirconium ammonium lactate (Orgatix ZC-300, manufactured by Matsumoto Fine Chemical Co. Ltd.), aluminum subacetate (manufactured by Wako Pure Chemical Industries, Ltd.), bisvinyl sulfone compound (VS-B (K-FJ-C)), manufactured by FUJIFINE Chemical CORPORATION), carboxylic acid zirconium ammonium salt (Zircosol AC-7 and AC-20, manufactured by DAIICHI KIGENSO KAGAKU KOGYO CO., LTD.), titanium triethanol aminate (Orgatix TC-400, manufactured by Matsumoto Fine Chemical Co. Ltd.), zirconium oxychloride (Zircosol ZC-20, manufactured by DAIICHI KIGENSO KAGAKU KOGYO CO., LTD.), zirconium oxynitrate (Zircosol ZN, manufactured by DAIICHI KIGENSO KAGAKU KOGYO CO., LTD.), glyoxyl acid salt (Sagelink SPM-01, manufactured by The Nippon Synthetic Chemical Industry Co., Ltd.), and adipic acid dihydrazide (manufactured by Otsuka Chemical Co., Ltd.).

In addition, a divalent or higher metal salt can improve the cross-linking strength, which is preferable in terms of enhancing the strength of an obtained solid freeform fabrication object. As the cationic metal ligand, lactate ions are preferably used because of its discharging stability and storage stability overtime of a liquid material for solid fabrication.

The solvent for the cross-linking agent solution is not particularly limited as long as it dissolves a cross-linking agent and can be suitably selected to suit to a particular application. For example, water, alcohol such as ethanol, ethane, and ketone can be used. These can be used alone or in combination.

The other optional components in the cross-linking agent solution can be appropriately selected in consideration of conditions such as the type of curing device, frequency of application of the cross-linking agent solution, and the amount of the cross-linking agent solution. For example, when an inkjet head is used as the curing device, it can be appropriately selected in consideration of the impact on nozzle clogging, etc.

In the curing, it is preferable that a predetermined region in the fabrication layer be cured by a cross-linking reaction between the binder material and the curing liquid. In the curing, when a predetermined region in the fabrication layer is cured by a cross-linking reaction between the binder material and the curing liquid, strength of a solid freeform fabrication object can be enhanced.

Note that the forming of a curing layer in the curing is not limited to the cross-linking reaction between the binder material and the curing liquid. For example, the binder material and the curing liquid are each cured to form a cured layer.

Predetermined Region

A solid freeform fabrication object is formed and cured in the predetermined region (fabrication region) in each fabrication layer.

For example, the fabrication region can be calculated based on two-dimensional data indicating a cut surface obtained by slicing a three-dimensional model in a direction parallel to the base of the three-dimensional model identified from three-dimensional data. The three-dimensional data of a solid freeform fabrication object means data representing a solid freeform fabrication object to be fabricated in a three-dimensional model.

Examples of the three-dimensional data include surface data and solid data having a three-dimensional shape designed by a three-dimensional Computer-Aided Design (CAD). Other examples of the three-dimensional data include surface data and solid data having a three-dimensional shape captured by a three-dimensional scanner or digitizer. The three-dimensional data may be converted into, for example, Standard Triangulated Language (STL) format in which the surface of the three-dimensional model is expressed as an aggregate of triangles.

Moreover, the method of identifying the base is not particularly limited and can be suitably selected to suit to a particular application. For example, in a three dimensional coordinate system on which a three-dimensional model is disposed, the direction where the length of the three dimensional model is the shortest is defined as Z axis direction and the point between the plane perpendicular to Z axis and the three dimensional model is defined as the base.

When the curing liquid is applied to a fabrication layer, the curing liquid penetrates into the porous structure of the fabrication layer due to the capillary force at the same time when the curing liquid lands on the fabrication layer. At this time, the amount of the curing liquid to be applied is determined depending on the voxel, which is the resolution of the fabrication data. The amount of the curing liquid to be applied is preferably from 1/2 to 1/1 of a value obtained by multiplying the voxel volume by the volume ratio of the solvent for forming a solid freeform fabrication material. For example, in the case of fabrication data created at 300 dpi with a laminated thickness of 60 mm, since the voxel volume corresponds to about 430 pL, the volume occupied by the porous structure is 172 pL, which is a value multiplied by the solvent ratio of 40 percent by volume. Therefore, in the case of fabrication data formed at 300 dpi with a laminated thickness of 60 mm, the amount of a single drop of the curing liquid is preferably 86 to 172 pL.

Cured Layer

The cured layer is a cured predetermined region of a fabrication layer formed of a solid freeform fabrication material. That is, the cured layer has a cured region that has been cured by the application of the curable liquid and an uncured region that has not been cured.

Separating and Separating Device

In the separation, the cured region and the uncured region of the cured layer are separated.

The separation device separates the cured region from the uncured region from the cured layer.

The separation is not particularly limited and can be suitably selected to suit to a particular application. For example, the separation includes disintegration by resting, ultrasonic wave irradiation, liquid stirring, etc.

The separation device has no specific limit and is suitably selected to suit to a particular application. For example, an ultrasonic wave irradiator or a liquid stirrer can be used.

In the separating or by the separating device, the portion other than the fabrication region is separated from a laminated object obtained by laminating the cured layers, thereby obtaining a solid freeform fabrication object having a desired shape.

The solid freeform fabrication object is not particularly limited and can be suitably selected to suit to a particular application.

The method of measuring porosity of a solid freeform fabrication object is not particularly limited and can be suitably selected to suit to a particular application. For example, porosity can be measured by Archimedes method using the even balance MS4035/02 and an accompanying density measurement kit (manufactured by Mettler Toledo International Inc.). In addition, if the porosity in a solid freeform fabrication object is 20 percent by volume or more, the porosity in the fabrication layer is also 20 percent by volume or more.

In addition, it is preferable that a film made of a binder material be formed on the surface of the powder material in a solid freeform fabrication object. When the film of the binder material is formed on the surface of the powder material in a solid freeform fabrication object, attachability between powder is enhanced and strength of a solid freeform fabrication object can be improved.

The film of the binder material is not necessarily formed on the entire surface of the powder material and may be partially formed thereon.

In addition, it is preferable that a film made of a binder material be formed on one side of the fabrication layer in a solid freeform fabrication object. When the film of the binder material is formed on one side of the fabrication layer of a solid freeform fabrication object, attachability between powder and between the fabrication layers is enhanced and strength of a solid freeform fabrication object can be further improved.

In addition, the film of the binder material is not necessarily formed on the entire of one side of the fabrication layer but may be partially formed thereon. Moreover, the thickness of the film of a binder material formed on one side of the fabrication layer is not necessarily uniform but can be locally different.

In addition, as described in the description of the void forming and the void forming device, the ratio of the powder material in the solid freeform fabrication object is preferably from 80 to 99 percent by volume and more preferably from 90 to 95 percent by volume.

Sintering and Sintering Device

In the sintering, a solid freeform fabrication object is sintered to form a sintered compact in which the cured layers are integrated.

The sintering device sinters a solid freeform fabrication object to form a sintered compact in which the cured layers are integrated.

The sintering device is not particularly limited as long as it can sinter a laminated fabrication object and can be suitably selected to suit to a particular application. An example is a known sintering furnace.

Other Processes and Other Devices

The other optional processes are not particularly limited and can be suitably selected to suit to a particular application. Examples are a surface protection process and a painting process.

The other optional devices are not particularly limited and can be suitably selected to suit to a particular application. Examples are a surface protection device and a painting device.

The surface protection can be suitably executed by the surface protection device, and the painting can be suitably executed by the painting device.

Surface Protection and Surface Protection Device

The surface protection is to form a protection layer on the surface of a solid freeform fabrication object formed in the curing or sintering. Due to the surface protection, a protection layer is formed on the surface of a solid freeform fabrication object to enhance durability of the solid freeform fabrication object.

Specific examples of the protection layer include, but are not limited to, a water-resistance layer, a weather resistance layer, a light resistance layer, a heat insulation layer, and a gloss layer.

Specific examples of the surface protection device include, but are not limited to, a known surface protection treatment device such as a spraying device and a coating device.

Painting and Painting Device

The painting is to paint a solid freeform fabrication object.

The painting device is to paint a solid freeform fabrication object.

Due to this painting, the solid freeform fabrication object is colored in a desired color. Specific examples of the painting device include, but are not limited to, a known painting device using a spray, a roller, a brush, etc.

Having generally described preferred embodiments of this disclosure, further understanding can be obtained by reference to certain specific examples which are provided herein for the purpose of illustration only and are not intended to be limiting. In the descriptions in the following examples, the numbers represent weight ratios in parts, unless otherwise specified.

EXAMPLES

Hereinafter, an embodiment of the method of manufacturing a solid freeform fabrication object of the present disclosure and the device for manufacturing a solid freeform fabrication object are described in detail with reference to the accompanying drawings but the present disclosure is not limited to this embodiment.

Figure 6:
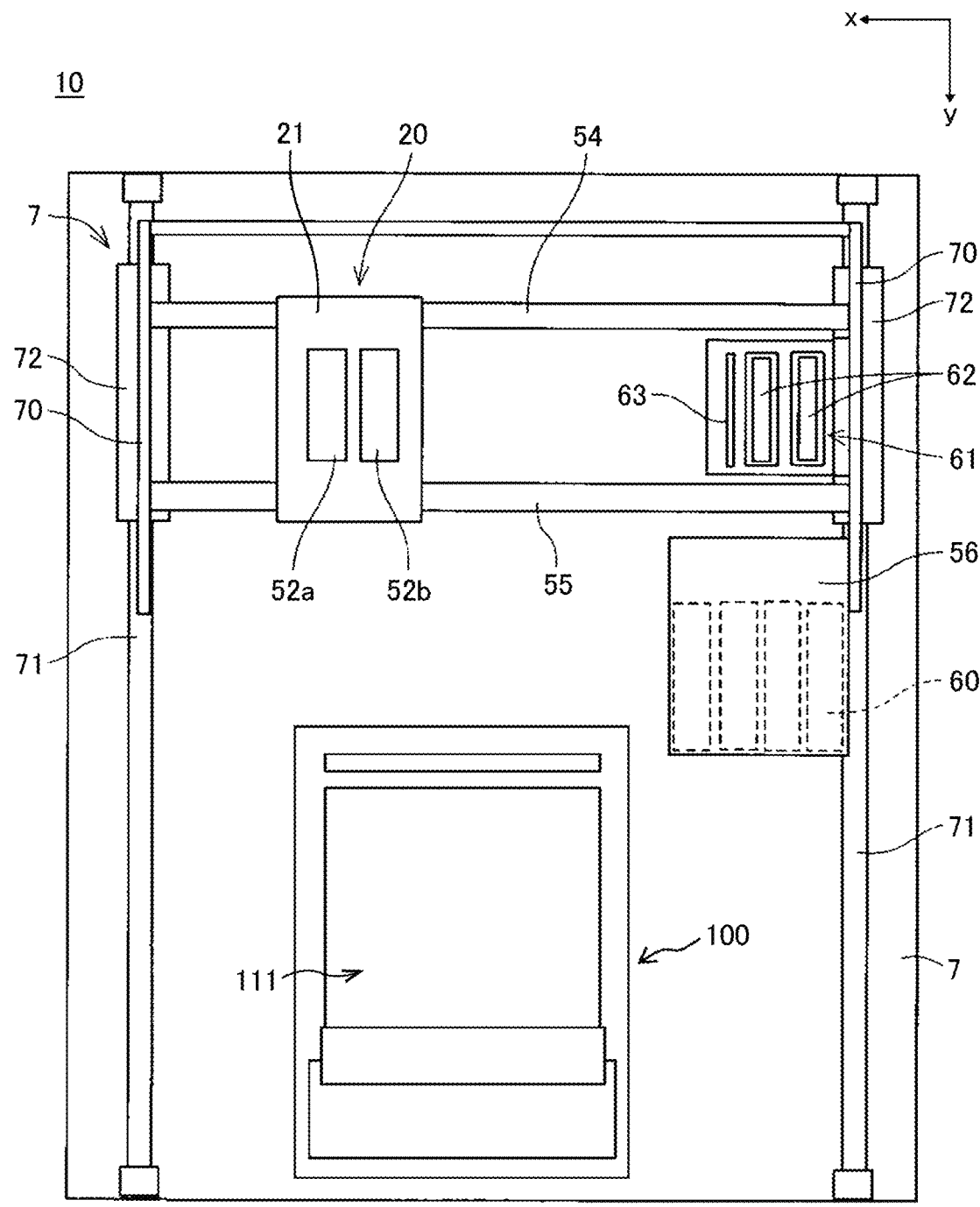
FIG. 6 is a schematic diagram illustrating a planar view of a part of a device for fabricating a solid freeform fabrication object.
Figure 7:
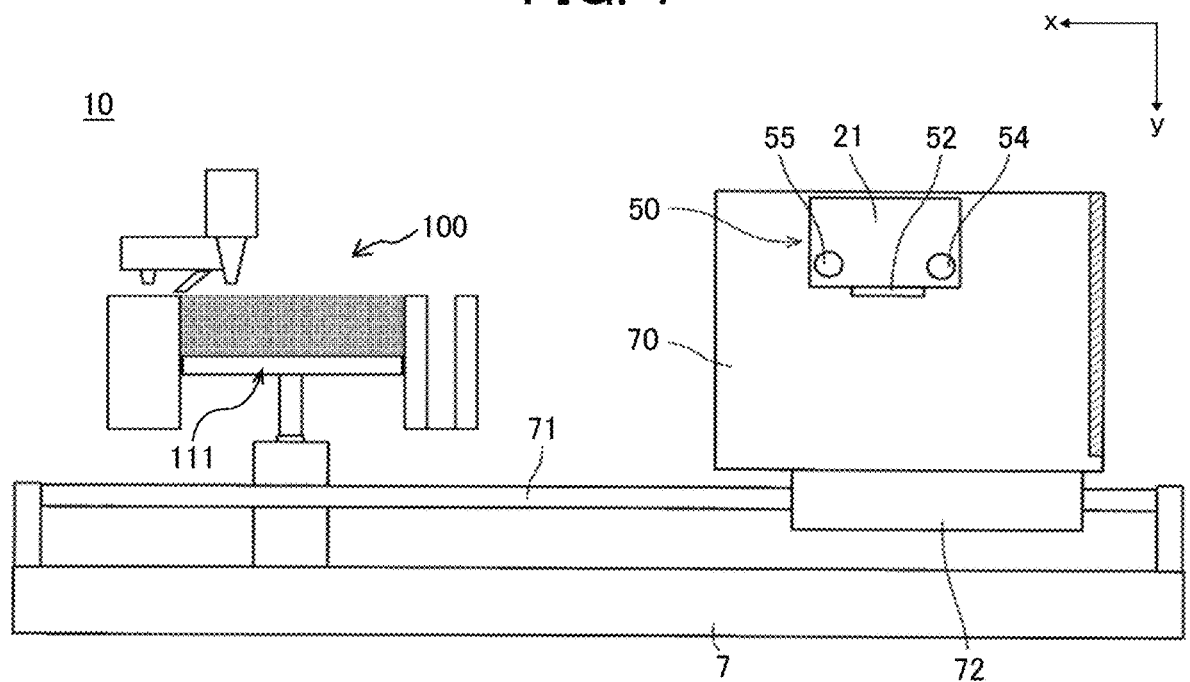
FIG. 7 is a schematic diagram illustrating a side view of a part of a device for fabricating a solid freeform fabrication object.

FIG. 6 is a schematic diagram illustrating a planar view of a part of a device for manufacturing a solid freeform fabrication object. FIG. 7 is a schematic diagram illustrating a side view of a part of a device for manufacturing a solid freeform fabrication object.

A device (solid freeform fabrication device) 10 for manufacturing a solid freeform fabrication object includes a layer forming device 100 that forms a fabrication layer made of a solid freeform fabrication material and a curing device (fabrication unit) 20 to discharge a curing liquid to the fabrication layer to form the solid freeform fabrication object.

In the solid freeform fabrication device 10, a unit holder 21 of the fabrication unit 20 is held movable on guiding members 54 and 55 disposed along the X direction. The fabrication unit 20 is reciprocated in the X direction and is movable relative to a fabrication stage 111 in the Y direction.

In addition, on one side of the fabrication unit 20 in the X direction, a maintenance assembly 61 is disposed to maintain and restore a discharging head 52.

The maintenance assembly 61 is mainly constituted of a cap 62 and a wiper 63. The cap 62 is in close contact with the nozzle surface (nozzle formed surface) of the discharging head 52 (52a and 52b), sucks the curing liquid from the nozzle, and releases the highly viscoused curing liquid clogged in the nozzle. The released curing liquid is pumped into a waste liquid tank. Thereafter, to form the meniscus forming (negative pressure in the nozzle) of the nozzle and remove the attached matter around the nozzle, the wiper 63 wipes off the nozzle surface. In addition, the maintenance assembly 61 can cover the nozzle surface of the discharging head 52 with the cap 62 to smoothly discharge the curing liquid, thereby preventing solidification of the curing liquid due to drying and curing of the curing liquid due to light.

The guiding members 54 and 55 holding the unit holder 21 of the fabrication unit 20 are held by side plates 70 on both sides. The side plates 70 include slider portions 72 held movable by the guiding member 71 disposed on a base member 7, and the fabrication unit 20 can reciprocate in the Y direction perpendicular to the X direction.

The curing liquid is supplied to the discharging head 52 by a cartridge 60 mounted exchangeable onto a cartridge mounting unit 56 via a supply tube. Note that when a color curing liquid such as black, cyan, magenta, and yellow is used, a plurality of nozzle arrays that discharge droplets of each color are arranged on the first discharging head 52a and the second discharging head 52b.

Figure 8:
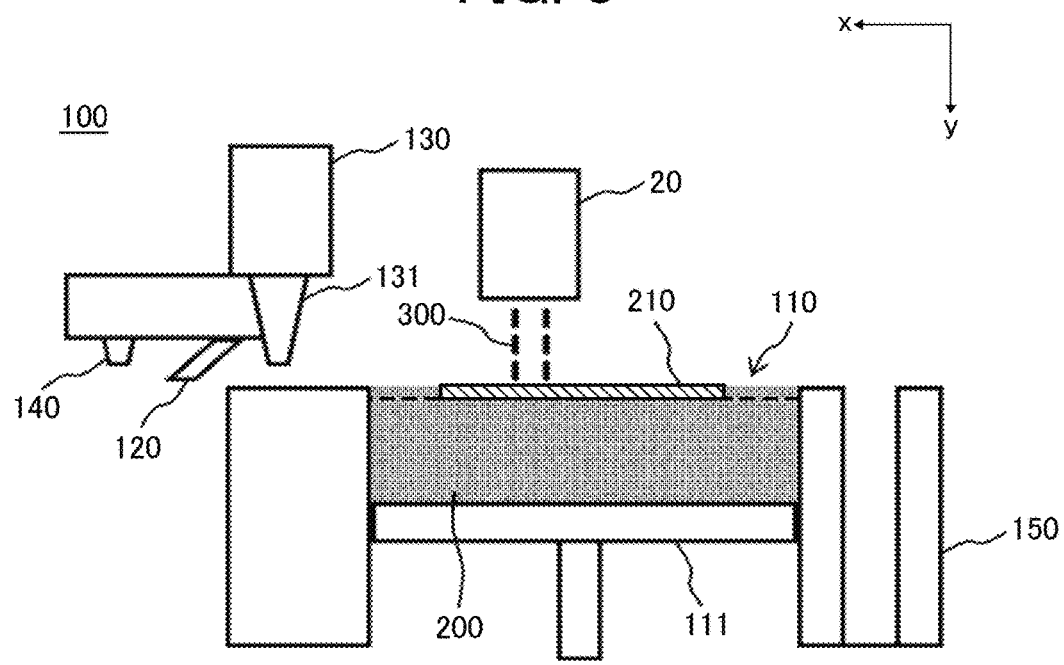
FIG. 8 is a diagram illustrating an example of a layer forming device and a void forming device in the device for manufacturing a solid freeform fabrication object.

FIG. 8 is a diagram illustrating an example of a layer forming device and a void forming device in the device for manufacturing a solid freeform fabrication object.

The layer forming device 100 includes a solid freeform fabrication material tank 110, a flattening member (blade) 120, a supply unit 130, and a blowing device 140. The flattening member 120 is not necessarily a blade but can be a rotating roller.

The base of the solid freeform fabrication material tank 110 freely lifts up and down in the vertical direction (height direction) as a fabrication stage 111. Due to the repetition of laminating the cured layers cured from the fabrication layers on the fabrication stage 111, a solid freeform fabrication object is fabricated. In addition, in this embodiment, the fabrication stage 111 is moved up and down. However, the present disclosure is not limited thereto. For example, the fabrication unit 20 may be moved up and down.

The supply unit 130 is mounted onto the flattening member 120 on the side of the solid freeform fabrication material tank 110. The supply unit 130 includes a slit 131 having a width equal to the width of the solid freeform fabrication material tank 110 and a solid freeform fabrication material 200 is supplied to the supply unit 130 through the slit 131. In addition, the solid freeform fabrication material 200 can be supplied from a supply tank provided to the solid freeform fabrication material tank 110 to the solid freeform fabrication material tank 110 using the flattening member 120 while determining the supply amount by the supply stage movable up and down.

The flattening member 120 is disposed so as to relatively reciprocate against the fabrication stage 111 and moved by a reciprocating assembly.

This flattening roller 120 has a plate-like form longer than the inside dimension (i.e., width of the portion where the power is supplied) of the solid freeform fabrication material tank 110 and is reciprocated in the Y direction (sub-scanning direction) along the stage surface by the reciprocating assembly.

The flattening member 120 conveys and supplies the solid freeform fabrication material 200 continuously discharged from the supply unit 130 to the solid freeform fabrication material tank 110 and levels the surface to form a fabrication layer having a predetermined thickness.

Further, a solid freeform fabrication material removing assembly to remove the solid freeform fabrication material 200 adhering to the flattening member 120 is independently disposed. The solid freeform fabrication material removing assembly is disposed at the initial position of the flattening member 120 and removes the solid freeform fabrication material 200 adhering to the flattening member 120 while the fabrication unit 20 is driven. The solid freeform fabrication material removing assembly is not limited to this. For example, it may be installed in the back of a solid freeform fabrication material dropping gutter 150.

A solid freeform fabrication material tank 110 has a box-like form and includes a tank with the top surface open. Inside the solid freeform fabrication material tank 110 is disposed the fabrication stage 111 movable up and down. The side of the fabrication stage 111 is disposed to abut on the inner surface of the solid freeform fabrication material tank 110. The upper surface of the fabrication stage 111 is held horizontal.

Around the solid freeform fabrication material tank 110, a solid freeform fabrication material dropping gutter 150 having a concave form is disposed with the upper surface open. The surplus of the solid freeform fabrication material 200 supplied by the flattening member 120 when forming a fabrication layer drops into the solid freeform fabrication material dropping gutter 150. The surplus of the solid freeform fabrication material that has dropped into the solid freeform fabrication material dropping gutter 150 is returned to the supply unit 130 that supplies the solid freeform fabrication material 200 to the solid freeform fabrication material tank 110.

In the present embodiment, the layer forming device 100 includes the blowing device 140 as the void forming device. The blowing device 140 blows air to the fabrication layer formed by the flattening member 120 to volatilize and remove the solvent contained in the solid freeform fabrication material 200 in such a manner that the porosity is 20 percent by volume or more. Further, the blowing device 140 is driven in synchronization with the layer forming device 100 so that it volatilizes and removes the solvent in the solid freeform fabrication material 200 immediately after the fabrication layer is formed.

Thereafter, the fabrication unit 20 applies a curing liquid 300 to a predetermined region of the fabrication layer where the blowing device 140 removes the solvent and the porosity is (determined to be) 20 percent by volume or more to form a cured layer 210.

Figure 9:
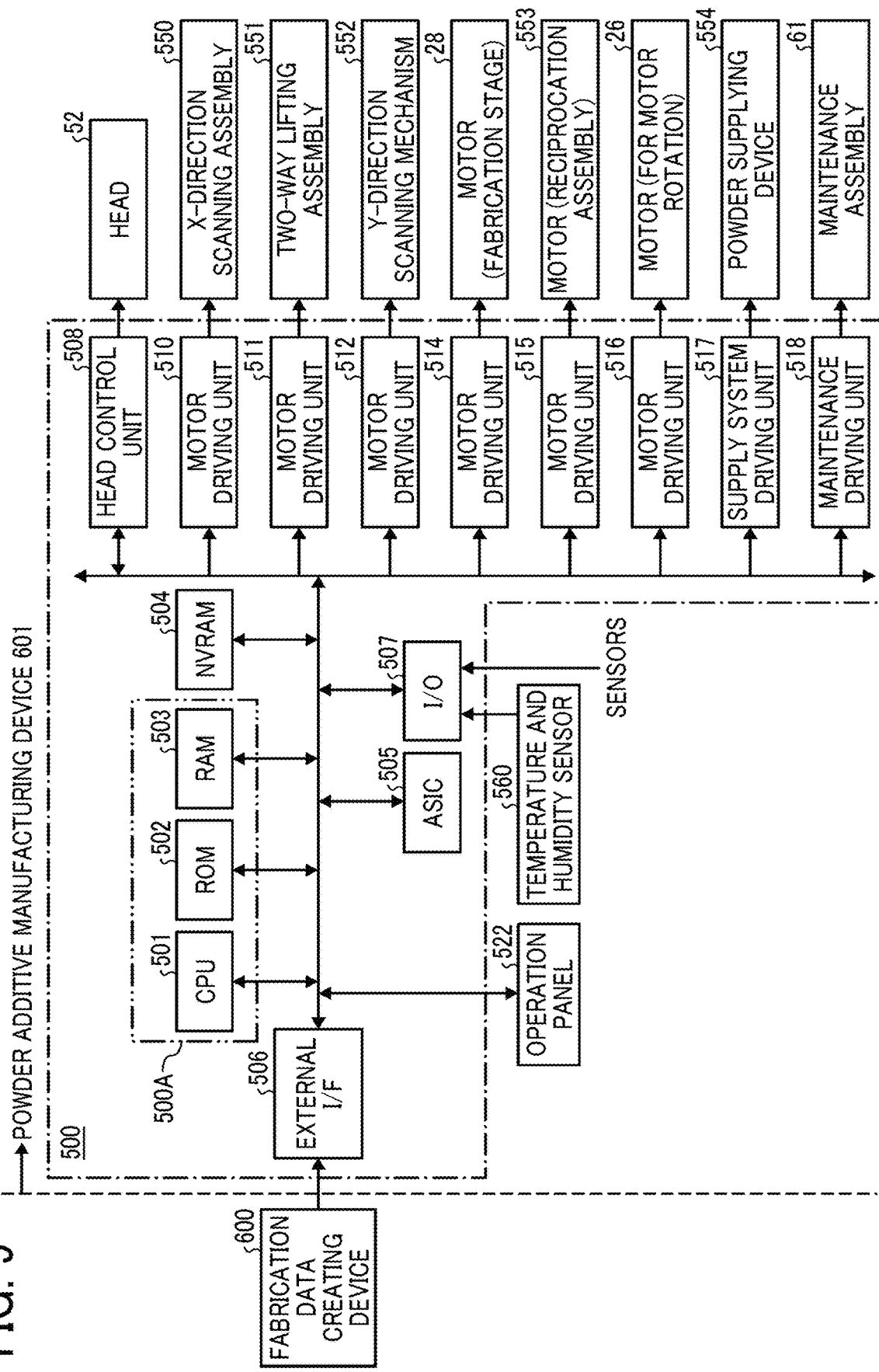
FIG. 9 is a block diagram illustrating an example of a control unit of a device for manufacturing a solid freeform fabrication object.

Next, the control unit of the device for solid freeform fabrication is described with reference to FIG. 9. FIG. 9 is a block diagram illustrating an example of a control unit of a device for manufacturing a solid freeform fabrication object.

A controller (control unit) 500 includes a main control unit 500A including a central processing unit (CPU) 501, a read only memory (ROM) 502, and a random access memory (RAM) 503.

The CPU 501 controls the entire of the solid freeform fabrication device 10. The ROM 502 stores a solid freeform fabrication program including a program to cause the CPU 501 to execute control of the solid freeform fabrication operation including control relating to the present disclosure and other fixed data. The RAM 503 temporarily stores fabrication data, etc.

The control unit 500 includes a non-volatile random access memory (NVRAM) 504 to hold data while the power to the device is blocked off. In addition, the control unit 500 includes an application specific integrated circuit (ASIC) 505 for image processing of various signal processing for image data and processing input and output signals to control the entire device.

The control unit 500 includes an interface (I/F) 506 to send and receive data and signals to be used at receiving fabrication data from an external fabrication data creating device 600.

In FIG. 10, the fabrication data creating device 600 creates two-dimensional data (fabrication data) indicating a cut surface obtained by slicing a fabrication object (solid freeform fabrication object) as the final product layered fabrication object by layered fabrication object and includes a data processing unit such as a home computer.

The control unit 500 includes an input-output (I/O) 507 to take in the detected signals of various sensors.

The control unit 500 includes a head drive control unit 508 to drive and control each head of the liquid discharging unit.

The control unit 500 includes a motor driving unit 510 to drive motors constituting the X direction scanning assembly 550 that moves the fabrication unit 20 in the X direction (main scanning direction) and a motor driving unit 512 that drives motors constituting the Y direction scanning assembly 552 to move the fabrication unit 20 in the Y direction (sub-scanning direction).

The control unit 500 includes a motor driving unit 511 to drive motors constituting a Z direction elevating assembly 551 that moves (elevates) up and down the fabrication unit 20 in the Z direction. It is also allowed to have a configuration that elevates the entire of the fabrication unit 20 in the Z direction indicated by the arrow.

The control unit 500 includes a motor driving unit 515 that drives a motor 553 of a reciprocating assembly that moves the flattening member 120.

The control unit 500 includes a supply-system driving unit 517 that drives a powder supply device 554 (layer forming device 100) that supplies the solid freeform fabrication material 200 to the solid freeform fabrication material tank 110 and a maintenance driving unit 518 that drives a maintenance assembly 61 of the fabrication unit 20.

The control unit 500 includes a motor driving unit 516 that drives the motor 26 and a motor driving unit 514 that drives the motor 28 that drives the fabrication stage 111.

Detected signals of a temperature and humidity sensor 560 that detects the temperature and the humidity as the environment condition of the device and detected signals (for example, image information acquired by an image acquisition device) from other sensors are input into an I/O 507 of the control unit 500.

The control unit 500 is connected with an operation panel 522 where information for the device is input and displayed.

As described above, the control unit 500 receives fabrication data from the fabrication data creating device 600. The control unit 500 is driven to fabricate a solid freeform fabrication object according to the input fabrication data. As a result, in the solid freeform fabrication device 10, a desired solid freeform fabrication object is fabricated.

Next, the flow of fabrication will be described in detail with reference to FIGS. 10A to 10E. FIGS. 10A to 10E are diagrams illustrating a flow of fabrication by a device for manufacturing a solid freeform fabrication object.

The description starts from the state in which the first cured layer 210 is formed on the fabrication stage 111 of the solid freeform fabrication material tank 110.

Figure 10A:
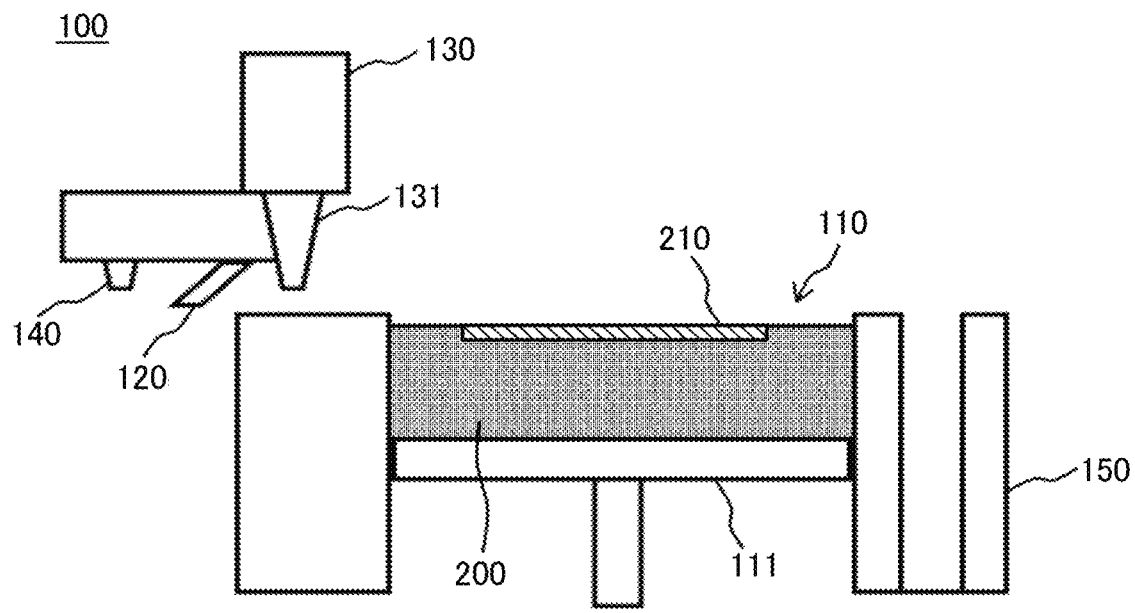
FIG. 10A is a diagram illustrating a flow of fabrication by a device for manufacturing a solid freeform fabrication object.

When forming the next fabrication layer on the fabrication layer, first, as illustrated in FIG. 10A, the fabrication stage of the fabrication tank is moved to the side of the solid freeform fabrication material tank.

At this time, the descending distance of the fabrication stage 111 is set in such a manner that the gap between the upper surface of the solid freeform fabrication material tank 110 and the lower portion of the flattening member 120 is $\Delta t1$. This gap $\Delta t1$ corresponds to the thickness of the fabrication layer to be formed next.

Since the flattening member 120 can move while keeping the distance from the upper surface of the solid freeform fabrication material tank 110 constant, a fabrication layer having a thickness of $\Delta t1$ can be formed on the formed fabrication layer while the flattening member 120 conveys the solid freeform fabrication material 200 onto the solid freeform fabrication material tank 110.

Figure 10B:
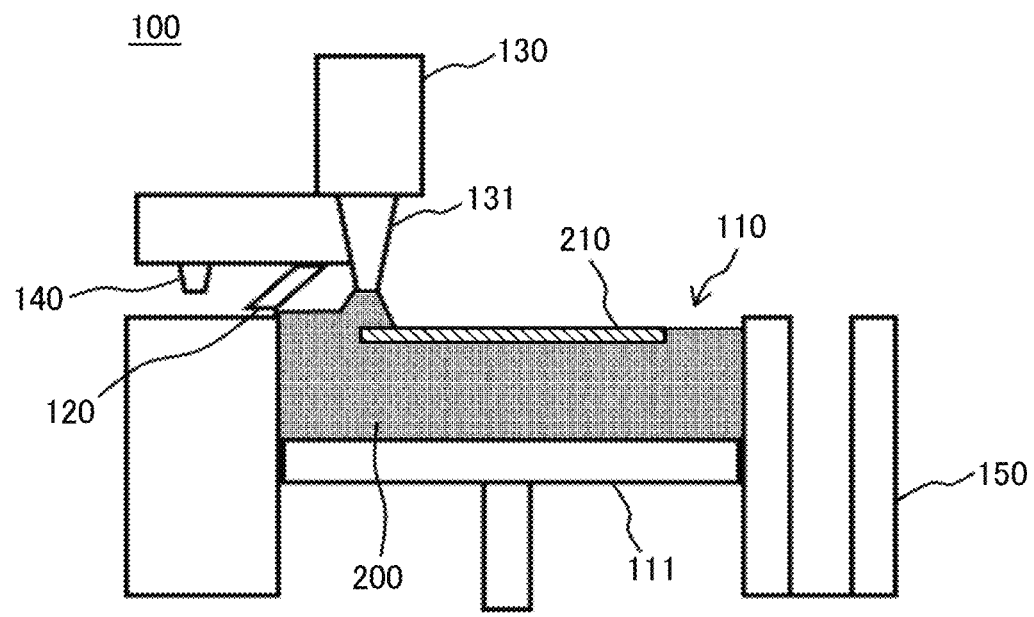
FIG. 10B is a diagram illustrating a flow of fabrication by a device for manufacturing a solid freeform fabrication object.

Next, as illustrated in FIG. 10B, the solid freeform fabrication material 200 is supplied from the slit 131 of the supply unit 130 to the solid freeform fabrication material tank 110. At this time, the layer forming device 100 supplies the solid freeform fabrication material 200 while moving in the right direction in FIG. 10B.

Figure 10C:
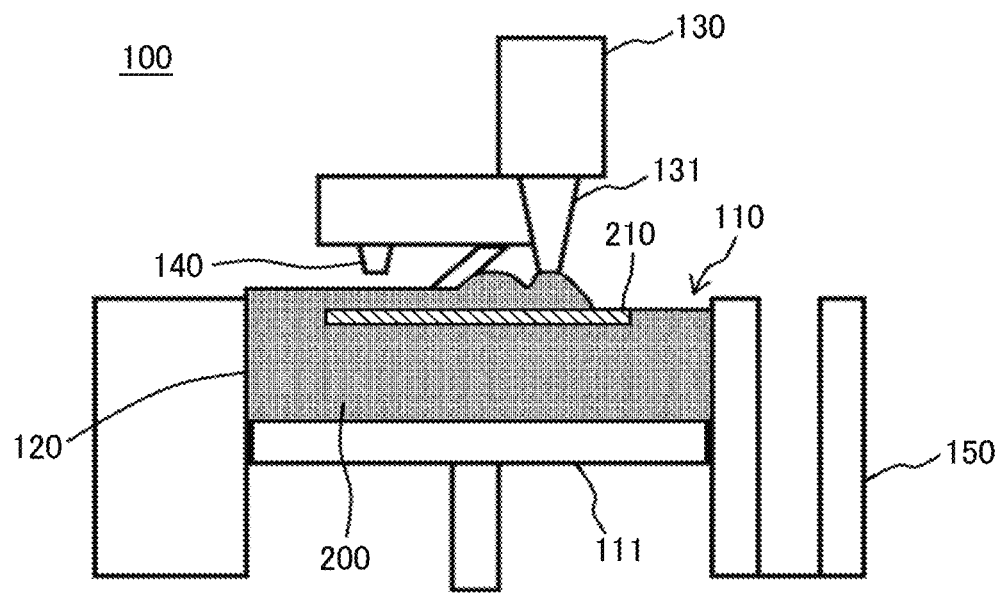
FIG. 10C is a diagram illustrating a flow of fabrication by a device for manufacturing a solid freeform fabrication object.

As the layer forming device 100 moves to the right side, as illustrated in FIG. 10C, the flattening member 120 flattens the solid freeform fabrication material 200, thereby forming a fabrication layer. At the same time when a fabrication layer is formed, the blowing device 140 blows air to the fabrication layer in order to volatilize and remove the solvent contained in the solid freeform fabrication material 200 in such a manner that the porosity is 20 percent by volume or more.

Figure 10D:
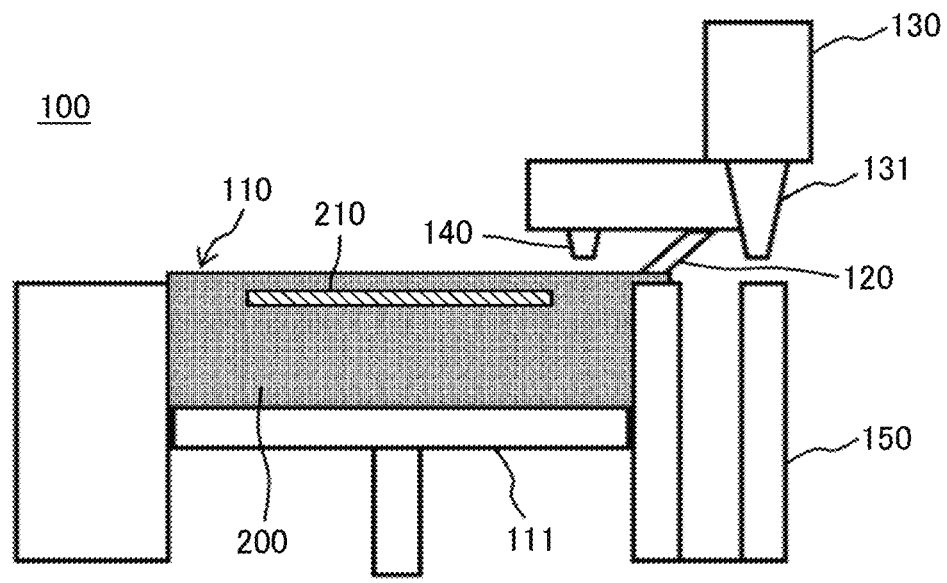
FIG. 10D is a diagram illustrating a flow of fabrication by a device for manufacturing a solid freeform fabrication object.

Thereafter, as illustrated in FIG. 10D, the flattening member 120 of the layer forming device 100 moves the layer forming device 100 until the flattening member 120 reaches the right end of the solid freeform fabrication material tank 110, thereby forming the second fabrication layer.

In addition, in order to sufficiently volatilize and remove the solvent contained in the solid freeform fabrication material 200 after the formation of the fabrication layer, the layer forming device 100 is reciprocated left and right while blowing air to the fabrication layer by the blowing device 140.

Figure 10E:
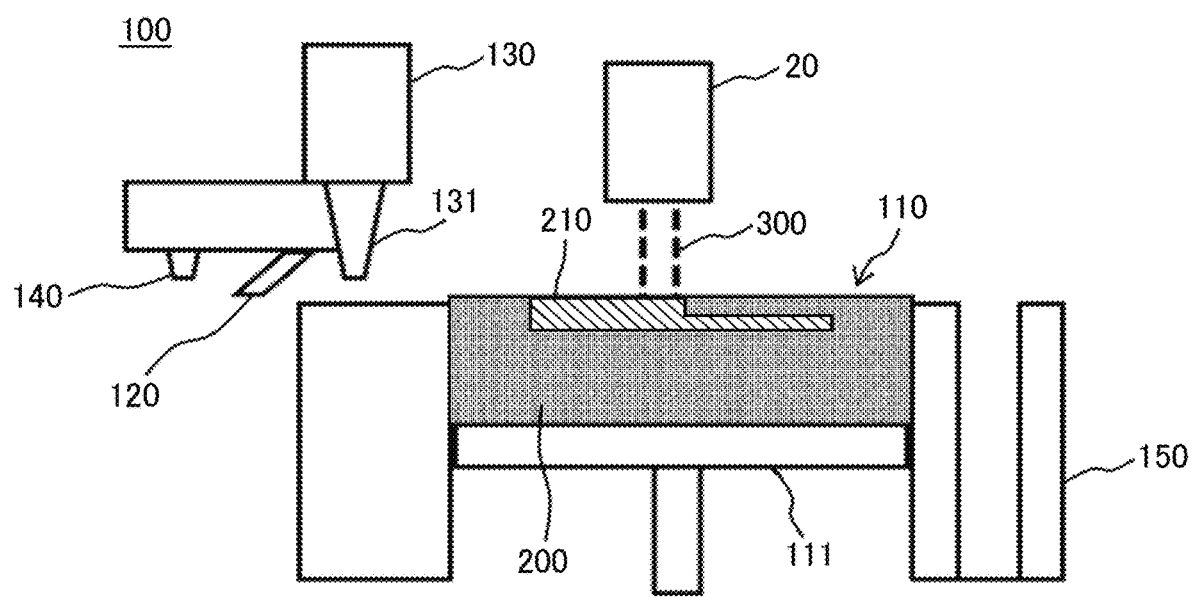
FIG. 10E is a diagram illustrating a flow of fabrication by a device for manufacturing a solid freeform fabrication object.

Subsequently, as illustrated in FIG. 10E, the fabrication unit 20 discharges droplets of the curing liquid 300 to a predetermined region on the fabrication layer to form the cured layer 210.

The solid freeform fabrication device 10 fabricates (manufactures) a solid freeform fabrication object by repeating supplying and flattening a solid freeform fabrication material to form a fabrication layer, forming voids in the fabrication layer, and applying the curing liquid to the fabrication layer to form a cured layer.

Next, embodiments of the present disclosure are described in detail with reference to Examples but are not limited thereto.

Example 1

Preparation of Solid Freeform Fabrication Material

A suspension (solid freeform fabrication material) was manufactured using SUS316L powder (PSS316L, manufactured by Sanyo Special Copper Co., Ltd.) having an average particle diameter D50 of 5.9 μm as powder material, PVA (DF-05, manufactured by JAPAN VAM & POVAL CO., LTD.) having a molecular weight of from about 20,000 to about 30,000 as a binder material, and pure water as a solvent. The suspension was defoamed and stirred with a centrifugal stirrer ("Awatori Nentaro", manufactured by THINKY CORPORATION) in such a manner that the volume ratio of each material was shown in Table 1.

Manufacturing of Solid Freeform Fabrication Object

Using the prepared suspension, a solid freeform fabrication object was manufactured by a solid freeform fabrication device as illustrated in FIG. 6. The thickness of each fabrication layer was 60 μm and the operation speed of the layer forming device was 20 mm/s. After forming the fabrication layer, air was blown to the fabrication layer by a blowing device to accelerate formation of voids therein. Thereafter, the curing liquid was applied to the fabrication layer in which voids were formed as a result of evaporation of the solvent to form a cured layer. Thereafter, the cured layer was laminated until the thickness reached 0.9 mm to fabricate a solid freeform fabrication object.

Examples 2 to 9 and Comparative Examples 1 to 4

Solid freeform fabrication objects of Examples 2 to 9 and Comparative Examples 1 to 4 were fabricated in the same manner as in Example 1 except that the composition of the solid freeform fabrication material was changed to the composition shown in Table 1.

The product names and the manufacturing companies of the components shown in Table 1 are as follows:

Acrylate resin: manufactured by Nippon Shokubai Co., Ltd.

Ethanol: manufactured by Wako Pure Chemical Industries, Ltd.

SUS316L having an average particle diameter of 3.0 μm, manufactured by Epson Atmix Corporation.

SUS316L having an average particle diameter of 14.5 μm: PSS316L, manufactured by SANYO SPECIAL STEEL Co., Ltd.

Al (aluminum), manufactured by Toyo Aluminium K.K.

Toluene, manufactured by Tokyo Chemical Industry Co., Ltd.

Ti (Titanium): TILOP, manufactured by Osaka Titanium Technologies Co., Ltd.

Porosity

The solid freeform fabrication objects manufactured in Examples 1 to 9 and Comparative Examples 1 to 4 were measured by Archimedes method using an even balance MS403S/02 and an attached density measurement kit (manufactured by Mettler Toledo International Inc.). The results are shown in Table 1.

Figure 11:
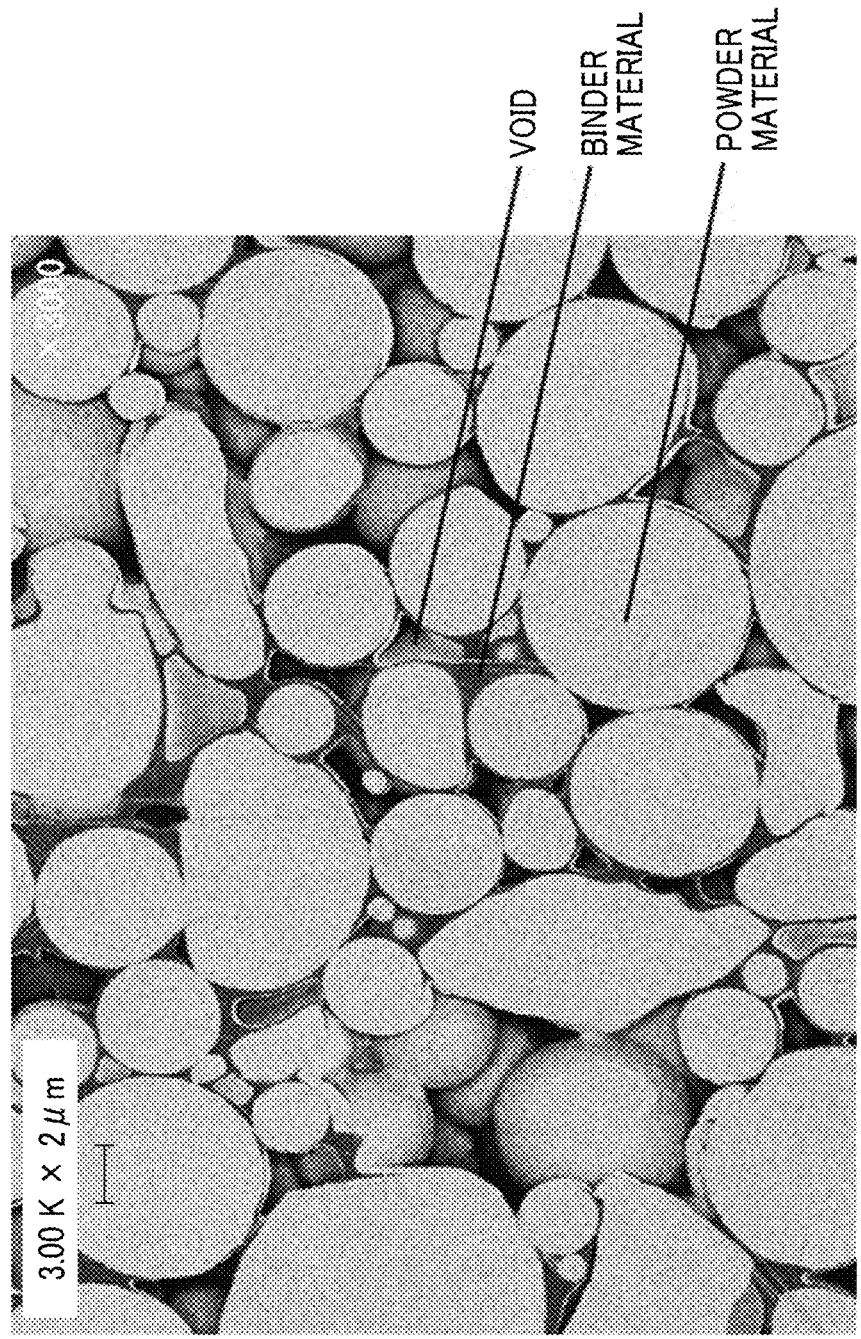
FIG. 11 is a scanning electron micrograph of a fabrication layer in a state where voids are formed in Example 1, which is described later.

FIG. 11 is a scanning electron micrograph of the fabrication layer in a state where voids are formed in Example 1. The micrograph of FIG. 11 was taken using a scanning electron microscope (JSM-7400F, manufactured by JEOL Ltd.).

Enable or Unable to Laminate Layers

Examples 1 to 9 and Comparative Examples 1 to 4 were subject to evaluation regarding whether or not lamination is possible based on the following evaluation criteria. The results are shown in Table 1.

Evaluation Criteria

A: Viscosity of solid freeform fabrication material was suitable and the fabrication layer was stably formed by the layer forming device B: Viscosity of solid freeform fabrication material was high and the fabrication layer was not formed by the layer forming device Permeability of Curing Liquid Examples 1 to 9 and Comparative Examples 1 to 4 were subject to evaluation regarding permeability of the curing liquid based on the following evaluation criteria. The results are shown in Table 1.

Evaluation Criteria

A: Voids were sufficiently formed in fabrication layer and curing liquid sufficiently permeated fabrication layer B: Voids were not sufficiently formed in fabrication layer and curing liquid did not sufficiently permeate fabrication layer Able or Unable to Fabricate Examples 1 to 9 and Comparative Examples 1 to 4 were subject to evaluation regarding whether or not fabrication was possible based on the following evaluation criteria. The results are shown in Table 1.

Evaluation Criteria

A: Sufficiently strong cured layer was formed so that a solid freeform fabrication object can be fabricated B: Sufficiently strong cured layer was not formed so that it was not possible to fabricate solid freeform fabrication object

TABLE 1

| | Powder material | Particle diameter (D50; μm) | binder material | Molecular weight of binder material | Solvent | Volume ratio (Powder material/ solvent) |
|---|---|---|---|---|---|---|
| Example 1 | SUS316L | 5.9 | PVA | 20,000 to 30,000 | Water | 1.35 |
| Example 2 | SUS316L | 5.9 | Acrylate | 600,000 | Ethanol | 1.35 |
| Example 3 | SUS316L | 5.9 | PVA | 20,000 to 30,000 | Water | 1.2 |
| Example 4 | SUS316L | 3.0 | PVA | 20,000 to 30,000 | Water | 1.35 |
| Example 5 | SUS316L | 14.5 | PVA | 20,000 to 30,000 | Water | 1.35 |
| Example 6 | Al | 20 | PVA | 20,000 to 30,000 | Toluene | 1.35 |
| Example 7 | Ti | 32 | PVA | 20,000 to 30,000 | Toluene | 1.35 |
| Example 8 | SUS316L | 5.9 | PVA | 20,000 to 30,000 | Water | 1.35 |
| Example 9 | SUS316L | 5.9 | PVA | 20,000 to 30,000 | Water | 1.35 |
| Comparative Example 1 | SUS316L | 5.9 | PVA | 20,000 to 30,000 | Water | 1.05 |
| Comparative Example 2 | SUS316L | 5.9 | PVA | 20,000 to 30,000 | Water | 0.9 |
| Comparative Example 3 | SUS316L | 5.9 | PVA | 20,000 to 30,000 | Water | 0.75 |
| Comparative Example 4 | SUS316L | 5.9 | PVA | 20,000 to 30,000 | Water | 2.1 |

| | Volume ratio of solid freeform fabrication material (powder material/binder material/solvent) | Ratio of binder material to total of powder material and binder material (percent by volume) | Void ratio after forming void | Enable or unable to laminate layers | Permeability of curing liquid | Able or unable to fabricate |
|---|---|---|---|---|---|---|
| Example 1 | 54/6/40 | 10 | 35 to 40 | A | A | A |
| Example 2 | 54/6/40 | 10 | 35 to 40 | A | A | A |
| Example 3 | 48/12/40 | 20 | 20 to 25 | A | A | A |
| Example 4 | 54/6/40 | 10 | 35 to 40 | A | A | A |
| Example 5 | 54/6/40 | 10 | 35 to 40 | A | A | A |
| Example 6 | 54/6/40 | 10 | 35 to 40 | A | A | A |
| Example 7 | 54/6/40 | 10 | 35 to 40 | A | A | A |
| Example 8 | 54/6/40 | 10 | 35 to 40 | A | A | A |
| Example 9 | 54/6/40 | 10 | 35 to 40 | A | A | A |
| Comparative Example 1 | 42/18/40 | 30 | 10 to 15 | A | B | — |
| Comparative Example 2 | 36/24/40 | 40 | 0 to 5 | A | B | — |
| Comparative Example 3 | 30/30/40 | 50 | 0 | A | B | — |
| Comparative Example 4 | 63/7/30 | 10 | — | B | — | — |

As described above, the method of manufacturing a solid freeform fabrication object of the present disclosure includes at least forming a fabrication layer containing a solid freeform fabrication material containing a powder material, a binding material, and a solvent, forming a void in the fabrication layer in a ratio of the void of 20 percent by volume or more in the fabrication layer, curing a predetermined region in the fabrication layer with a curing liquid to form a cured layer.

According to this, a method of manufacturing a solid freeform fabrication object is provided which makes curing liquid easily permeate a fabrication layer containing a powder material to enhance fabrication accuracy and strength of a solid freeform fabrication object while preventing scattering of powder material having a small particle diameter and deterioration of filling property.

Aspects of the present disclosure are, for example, as follows.

1. A method of manufacturing a solid freeform fabrication object includes forming a fabrication layer containing a solid freeform fabrication material containing a powder material, a binder material, and a solvent, forming a void in the fabrication layer in a ratio of the void of 20 percent by volume or more in the fabrication layer, curing a predetermined region in the fabrication layer by applying a curing liquid to the predetermined region to form a cured layer, and laminating the cured layer.
2. The method according to 1 mentioned above, wherein the forming a void in the fabrication layer includes removing the solvent from the fabrication layer.
3. The method according to 2 mentioned above, wherein the removing includes blowing air to the fabrication layer to volatilize the solvent.
4. The method according to any one of 1 to 3 mentioned above, wherein the predetermined region is cured utilizing cross-linking reaction of the binder material and the curing liquid.
5. The method according to any one of 1 to 4 mentioned above, wherein the powder material has a film of the binder material on the surface of the powder material.
6. The method according to any one of 1 to 5 mentioned above, wherein a film of the binder material is formed on one side of the fabrication layer.
7. The method according to any one of 1 to 6 mentioned above, wherein the proportion of the powder material is from 80 to 99 percent by volume in the solid freeform fabrication object.
8. The method according to any one of 1 to 7 mentioned above, wherein the proportion of the void is 45 percent by volume or less in the solid freeform fabrication object.
9. The method according to any one of 1 to 8 mentioned above, the volume ratio of the powder material to the solvent in the solid freeform fabrication material is from 1.1 to 1.5.
10. A device for manufacturing a solid freeform fabrication object includes a layer forming device configured to form a fabrication layer containing a solid freeform fabrication material containing a powder material, a binder material, and a solvent, a void forming device configured to form a void in the fabrication layer in a proportion of the void of 20 percent by volume or more in the fabrication layer, and a curing device configured to apply a curing liquid to a predetermined region in the fabrication layer to cure the predetermined region to form a cured layer.
11. The device according to 10 mentioned above, wherein the void forming device removes the solvent from the fabrication layer.
12. The device according to 11 mentioned above, wherein the void forming device blows air to the fabrication layer to volatilize and remove the solvent.
13. The device according to 11 or 12 mentioned above, wherein the void forming device is driven in synchronization with the layer forming device.
14. The device according to any one of 11 to 13 mentioned above, wherein the binder material is cross-linked with the curing liquid to cure the predetermined region in the fabrication layer.
15. The device according to any one of 11 to 14 mentioned above, wherein the powder material has a film of the binder material on a surface of the powder material.
16. The device according to any one of 11 to 15 mentioned above, wherein a film of the binder material is formed on one side of the fabrication layer.
17. The device according to any one of 11 to 16 mentioned above, wherein the proportion of the powder material is from 80 to 99 percent by volume in the solid freeform fabrication object.
18. The device according to any one of 11 to 17 mentioned above, wherein the proportion of the void is 45 percent by volume or less in the solid freeform fabrication object.
19. The device according to any one of 11 to 18 mentioned above, wherein a volume ratio of the powder material to the solvent in the solid freeform fabrication material is from 1.1 to 1.5.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A method of manufacturing a solid freeform fabrication object, the method comprising:
    forming a fabrication layer comprising a solid freeform fabrication material comprising a powder material, a binder material, and a solvent;
    forming a film of the binder material on one surface of the fabrication layer and forming voids in the fabrication layer, the voids comprising 20 percent by volume or more in the fabrication layer; and
    curing a predetermined region in the fabrication layer by applying a curing liquid to the predetermined region to form a cured layer.
2. The method according to claim 1, wherein the step of forming the voids comprises removing the solvent from the fabrication layer.
3. The method according to claim 2, wherein the removing step comprises blowing air to the fabrication layer to volatilize the solvent.
4. The method according to claim 1, wherein the curing step comprises cross-linking the binder material and the curing liquid.
5. The method according to claim 1, wherein the powder material has a film of the binder material on a surface of the powder material.

6. The method according to claim 1, wherein a proportion of the powder material is from 80 to 99 percent by volume in the solid freeform fabrication object.

7. The method according to claim 1, wherein the voids comprise 45 percent by volume or less in the solid freeform fabrication object.

8. The method according to claim 1, wherein a proportion of the powder material is from 1.1 to 1.5 percent by volume in the solvent.

9. A device for manufacturing a solid freeform fabrication object, the device comprising:
- a layer forming device configured to form a fabrication layer comprising a solid freeform fabrication material comprising a powder material, a binder material, and a solvent;
- a void forming device configured to form a film of the binder material on one surface of the fabrication layer and form voids in the fabrication layer, the voids comprising 20 percent by volume or more in the fabrication layer; and
- a curing device configured to apply a curing liquid to a predetermined region in the fabrication layer to cure the predetermined region to form a cured layer.

10. The device according to claim 9, wherein the void forming device is further configured to remove the solvent from the fabrication layer.

11. The device according to claim 10, wherein the void forming device is further configured to blow air to the fabrication layer to volatilize and remove the solvent.

12. The device according to claim 10, wherein the void forming device is configured to be driven in synchronization with the layer forming device.

13. The device according to claim 9, wherein the curing device is further configured to apply the curing liquid, which is cross-linked with the binder material, to cure the predetermined region in the fabrication layer.

14. The device according to claim 9, wherein the layer forming device is further configured to form the fabrication layer comprising the solid free form fabrication material comprising the powder material, which has a film of the binder material on a surface of the powder material.

15. The device according to claim 9, wherein the layer forming device is further configured to form the fabrication layer so that a proportion of the powder material is from 80 to 99 percent by volume in the solid freeform fabrication object.

16. The device according to claim 9, wherein the void forming device is further configured to form the voids so that the voids comprise 45 percent by volume or less in the solid freeform fabrication object.

17. The device according to claim 9, wherein the layer forming device is further configured to form the fabrication layer so that a volume ratio of the powder material to the solvent in the solid freeform fabrication material is from 1.1 to 1.5.

18. The method of claim 1, wherein the step of forming the voids comprises forming the voids to comprise between 30% and 45% by volume of the fabrication layer.

* * * * *